(12) United States Patent
Lee et al.

(10) Patent No.: US 7,807,497 B2
(45) Date of Patent: *Oct. 5, 2010

(54) PHASE-CHANGE MATERIAL LAYERS, METHODS OF FORMING THE SAME, PHASE-CHANGE MEMORY DEVICES HAVING THE SAME, AND METHODS OF FORMING PHASE-CHANGE MEMORY DEVICES

(75) Inventors: Jin-Il Lee, Seongnam-si (KR); Sung-Lae Cho, Yongin-si (KR); Young-Lim Park, Anyang-si (KR); Hye-Young Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 488 days.

This patent is subject to a terminal disclaimer.

(21) Appl. No.: 11/826,048

(22) Filed: Jul. 12, 2007

(65) Prior Publication Data
US 2008/0017841 A1     Jan. 24, 2008

(30) Foreign Application Priority Data
Jul. 12, 2006     (KR) .................. 10-2006-0065562

(51) Int. Cl.
    *H01L 45/00* (2006.01)
(52) U.S. Cl. .................. 438/102; 257/E21.027; 257/E21.029; 257/E21.17; 257/E21.586; 438/95
(58) Field of Classification Search .......... 257/E21.027, 257/E21.029, E21.17, E21.586; 438/95, 438/102
See application file for complete search history.

(56) References Cited

U.S. PATENT DOCUMENTS

| 5,596,522 | A | 1/1997 | Ovshinsky et al. |
| 5,825,046 | A | 10/1998 | Czubatyj et al. |
| 6,930,060 | B2 | 8/2005 | Chou et al. |
| 7,569,417 | B2 * | 8/2009 | Lee et al. .................. 438/102 |
| 2006/0014398 | A1 | 1/2006 | Song et al. |
| 2006/0113520 | A1 | 6/2006 | Yamamoto et al. |

(Continued)

FOREIGN PATENT DOCUMENTS

JP         03-169681         7/1991

(Continued)

*Primary Examiner*—Asok K Sarkar
(74) *Attorney, Agent, or Firm*—Harness, Dickey & Pierce, P.L.C.

(57) ABSTRACT

Example embodiments may provide phase-change material layers and a method of forming a phase-change material layer and devices using the same by generating a plasma including helium and/or argon in a reaction chamber, forming a first material layer on the object by introducing a first source gas including a first material, forming a first composite material layer on the object by introducing a second source gas including a second material into the reaction chamber, forming a third material layer on the first composite material layer by introducing a third source gas including a third material, and forming a second composite material layer on the first composite material layer by introducing a fourth source gas including a fourth material. Example embodiment phase-change material layers including carbon may be more easily and/or quickly formed at lower temperatures under the helium/argon plasma environment by providing the source gases for various feeding times. Example embodiments may also include memory devices using phase-change memory layers.

32 Claims, 16 Drawing Sheets

U.S. PATENT DOCUMENTS

2006/0138393 A1  6/2006  Seo et al.

FOREIGN PATENT DOCUMENTS

| KR | 10-2000-0052840 | 8/2000 |
|---|---|---|
| KR | 10-0437458 | 6/2004 |
| KR | 10-2005-0031160 | 4/2005 |
| KR | 10-2006-0008027 | 1/2006 |
| KR | 10-2006-0017737 | 2/2006 |

* cited by examiner

PHASE-CHANGE MATERIAL LAYERS, METHODS OF FORMING THE SAME, PHASE-CHANGE MEMORY DEVICES HAVING THE SAME, AND METHODS OF FORMING PHASE-CHANGE MEMORY DEVICES

PRIORITY STATEMENT

This application claims priority under 35 U.S.C. §119 to Korean Patent Application No. 2006-65562 filed on Jul. 12, 2006 in the Korean Patent Office, the entire contents of which are herein incorporated by reference.

BACKGROUND

1. Field

Example embodiments may relate to phase-change material layers, methods of forming a phase-change material layer, and/or methods of manufacturing a memory device including a phase-change material layer. For example, example embodiments may relate a phase-change material layer that may be formed by using a plasma at a relatively lower temperature, a method using a plasma at a relatively lower temperature, and/or a method of manufacturing a phase-change memory device including a phase-change material layer using a plasma.

2. Description of the Related Art

Semiconductor memory devices may be generally divided into volatile semiconductor memory devices such as dynamic random access memory (DRAM) devices or static random access memory (SRAM) devices, and non-volatile semiconductor memory devices such as flash memory devices or electrically erasable programmable read only memory (EEPROM) devices. The volatile semiconductor memory device may lose stored data if power is discontinued. The non-volatile semiconductor memory device may retain stored data even though power is discontinued.

Among related art non-volatile semiconductor memory devices, flash memory devices have been used in various electronic apparatuses such as digital cameras, cellular phones, MP3 players, and/or similar devices. Programming and/or reading may require relatively longer amounts of time for flash memory devices. Semiconductor memory device such as a magnetic random access memory (MRAM) device, a ferroelectric random access memory (FRAM) device, and/or a phase-change random access memory (PRAM) device may require smaller amounts of time to program and/or read.

The phase-change memory device may store information by exploiting resistance differences between amorphous phases and crystalline phases of a phase-change material layer including a chalcogenide compound such as germanium-antimony-tellurium (GST) or the like. The PRAM device may store data as "0" and "1" using a reversible phase transition of the phase-change material layer. An amorphous phase of the phase-change material layer may have a larger resistance than a crystalline phase of the phase-change material layer. In the PRAM device, a transistor formed on a substrate may provide a phase-change material layer with a reset current ($I_{reset}$) for changing the phase of the phase-change material layer from a crystalline state into an amorphous state. The transistor may also supply the phase-change material layer with a set current ($I_{set}$) for changing the phase of the phase-change material layer from the amorphous state into the crystalline state. Related art PRAM devices and related art methods of manufacturing a PRAM device may include forming a phase-change material layer of GST through a sputtering process and/or an evaporation process.

In related art method of manufacturing the PRAM device, the phase-change material layer including GST may be formed by a physical vapor deposition (PVD) process such as a sputtering process and/or an evaporation process, but phase-change material formation rate in these processes may not be properly controlled. Phase-change material layers may not have a dense crystalline structure and/or not have a face centered cubic (FCC) crystalline structure, such an FCC structure providing better electrical characteristics. Further, concentration ratios among germanium, antimony, and/or tellurium may not be adequately controlled if the phase-change material layer is formed by the PVD process. The phase-change material layers formed by the PVD process may not have adequate phase transition if a set current is applied to the phase-change material layer. Phase-change material formation rate may be relatively slower such that manufacturing cost and time may be higher.

SUMMARY

Example embodiments may provide a phase-change material layer having a composition obtained using a plasma at a low temperature to ensure improved characteristics.

Example embodiments may provide a method of forming a phase-change material layer using a plasma at a low temperature.

Example embodiments may provide a method of manufacturing a phase-change memory device having improved electrical characteristics using a plasma at a low temperature.

Example embodiments may provide a method of forming a phase-change material layer including loading an object into a reaction chamber, generating a plasma including, for example, helium, in the reaction chamber, forming a first material layer on the object by providing a first source gas including a first material in the reaction chamber, and/or forming a first composite material layer on the object by providing a second source gas including a second material in the reaction chamber. The first composite material layer may include the first material and/or the second material. A third material layer may then be formed on the first composite material layer by providing a third source gas including a third material in the reaction chamber. A second composite material layer may be formed on the first composite material layer by providing a fourth source gas including a fourth material in the reaction chamber. The second composite material layer may include the third material and/or the fourth material.

Generating a plasma in example embodiments may include introducing, for example, a helium gas may be into the reaction chamber. The helium gas may be pre-heated, and then the pre-heated helium gas may be stabilized. A helium plasma may be generated from the stabilized helium gas. For example, the helium gas may be pre-heated for about 30 seconds to about 90 seconds, and the pre-heated helium gas may be stabilized for about 1 second to about 4 seconds. The helium plasma may be generated by applying a power of about 20 Watts to about 200 Watts to the stabilized helium gas for about 5 seconds to about 15 seconds.

In example embodiments, the plasma may further include, for example, an argon plasma. The argon plasma may be generated by simultaneously introducing, for example, an argon gas and a helium gas into the reaction chamber. Flow rate ratio between the helium gas and the argon gas may be in a range of about 1.0:0.06 to about 1.0:1.5.

In example embodiments, the first material may include germanium (Ge) and/or the third material may include antimony (Sb). For example, the first material may include Ge(iso-Propane)$_3$H, GeCl$_4$, Ge(Methane)$_4$, Ge(Methane)$_4$N$_3$, Ge(Ethane)$_4$, Ge(Methane)$_3$N(Ethane)$_2$, Ge(iso-Butane)$_3$H, Ge(n-Butane)$_4$, Sb(GeEthane$_3$)$_3$ and/or Ge(Cyclopropane)$_2$. These may be used alone or in combination. Additionally, the third material may include Sb(iso-Butane)$_3$, SbCl$_3$, SbCl$_5$, Sb(Methane$_3$), Sb(Ethane)$_3$, Sb(iso-Propane)$_3$, Sb(t-Butane)$_3$, Sb[N(Methane)$_2$]$_3$ and/or Sb(Cyclopropane)$_3$. These may be used alone or in combination.

In example embodiments, the first source gas may be heated to about 100° C. to about 300° C. for about 0.1 second to about 2.0 seconds. The first material layer may be formed by applying a power of about 20 Watts to about 200 Watts at a pressure of about 1 Torr to about 5 Torr.

In example embodiments, the first through fourth source gases may each be provided with carrier gases including, for example, argon.

In example embodiments, a first purge gas including helium, argon, and/or another noble gas may be introduced into the reaction chamber before providing the second source gas.

In example embodiments, the second and/or fourth material may include tellurium (Te). For example, the second and/or the fourth materials may each include Te(iso-Butane)$_2$, TeCl$_4$, Te(Methane)$_2$, Te(Ethane)$_2$, Te(n-Propane)$_2$, Te(iso-Propane)$_2$ and/or Te(t-Butane)$_2$. These may be used alone or in any combination.

In example embodiments, the second and the fourth source gases may be heated to about 100° C. to about 300° C. for about 0.1 second to about 1 second. Additionally, the first and the second composite material layers may be formed by applying a power of about 20 Watts to about 200 Watts at a pressure of about 1 Torr to about 5 Torr.

In example embodiments, the third source gas may be heated to about 100° C. to about 300° C. for about 0.1 second to about 1 second. The third material layer may be formed by applying a power of about 20 Watts to about 200 Watts at a pressure of about 1 Torr to about 5 Torr.

In example embodiments, a second purge gas including helium, argon, and/or another noble gas may be introduced into the reaction chamber before providing the third and fourth source gas.

In example embodiments, a fourth purge gas including helium, argon, and/or another noble gas may be introduced into the reaction chamber after forming the second composite material layer.

In example embodiments, the first material may include antimony and the third material may include germanium.

In example embodiments, the first composite material and the second composite material layer may be repeated at least once. The first composite material and the second composite material layer may be alternately formed.

Example embodiments may provide a method of forming a phase-change material layer including germanium-antimony-tellurium. In example methods of forming phase-change material layers, a germanium layer may be formed on a substrate loaded in a reaction chamber by placing a substrate in a first source gas including germanium under an atmosphere including a helium, argon, and/or other noble gas plasma. A germanium-tellurium layer may be formed by providing a second source gas including tellurium. An antimony layer may be formed on the germanium-tellurium layer by a third source gas including antimony interacting with the germanium-tellurium layer. An antimony-tellurium layer may be formed on the germanium-tellurium layer by a fourth source gas including tellurium interacting with the antimony layer.

In example embodiments, the helium, argon, and/or other noble gas plasma may be generated by introducing a helium, argon, and/or other noble gas into a reaction chamber, pre-heating the gases, stabilizing the pre-heated gases, and/or generating the plasma from the stabilized gases.

In example embodiments, a first purge gas including helium, argon, and/or other noble gas may be introduced into the reaction chamber for about 0.1 second to about 2 seconds before providing the second source gas. A second purge gas including helium, argon, and/or other noble gas may be introduced into the reaction chamber for about 0.1 second to about 2 seconds before providing the third source gas. A third purge gas including helium, argon, and/or other noble gas may be introduced into the reaction chamber for about 0.1 second to about 2 seconds before providing the fourth source gas. A fourth purge gas including helium, argon, and/or other noble gas may be introduced into the reaction chamber for about 0.1 second to about 2 seconds after forming the antimony-tellurium layer.

In example embodiments, the second source gas may be substantially similar to the fourth source gas.

In example embodiments, the phase-change material layer may include about 1 to about 6 percent by weight carbon, about 15 to about 30 percent by weight germanium, about 15 to about 25 percent by weight antimony, and/or tellurium for the remaining weight percentage.

Example embodiments may provide a phase-change material layer including carbon-germanium-antimony-tellurium. The phase-change material layer may include about 1 to about 6 percent by weight carbon, about 15 to about 30 percent by weight germanium, about 15 to about 25 percent by weight antimony, and/or tellurium for the remaining weight percentage.

In example embodiments, the phase-change material layer may have a face centered cubic (FCC) crystalline structure grown along a plane of (200).

In example embodiments, the phase-change material layer may include uniform grains having sizes of about 2 mm to about 15 mm.

Example embodiments may provide a method of manufacturing a phase-change memory device. In example methods of manufacturing phase-change memory devices, a lower electrode may be formed on a substrate. A phase-change material layer including a germanium-antimony-tellurium (GST) compound may be formed on the lower electrode. An upper electrode may be formed on the phase-change material layer. The phase-change material layer may include a first layer formed on the lower electrode by a first source gas including a first material on the lower electrode under an atmosphere including, for example, a helium, argon, and/or other noble gas plasma. A first composite material layer may be formed on the lower electrode by a second source gas including a second material on the first layer. The first composite material layer may include the first material and the second material. A third material layer may be formed on the first composite material layer by a third source gas including a third material on the first composite material layer. A second composite material layer may be formed on the first composite material layer by a fourth source gas including a fourth material on the third layer. The second composite material layer may include the third material and the fourth material.

In example embodiments, a contact region may be formed on a portion of the substrate. The lower electrode may be electrically connected to the contact region.

Example embodiments may include a phase-change material layer including carbon that may be formed at a lower temperature under a helium, argon, and/or other noble gas plasma environment by providing source gases for layer formation. A phase-change material layer including carbon may have a crystalline structure such as an FCC structure. The phase-change material layer including carbon may have improved electrical characteristics, for example, a lower reset current and/or an improved set resistance. Manufacturing costs and/or time may be reduced because the phase-change material layer including carbon may be obtained by a simpler process.

BRIEF DESCRIPTION OF THE DRAWINGS

The above and/or other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
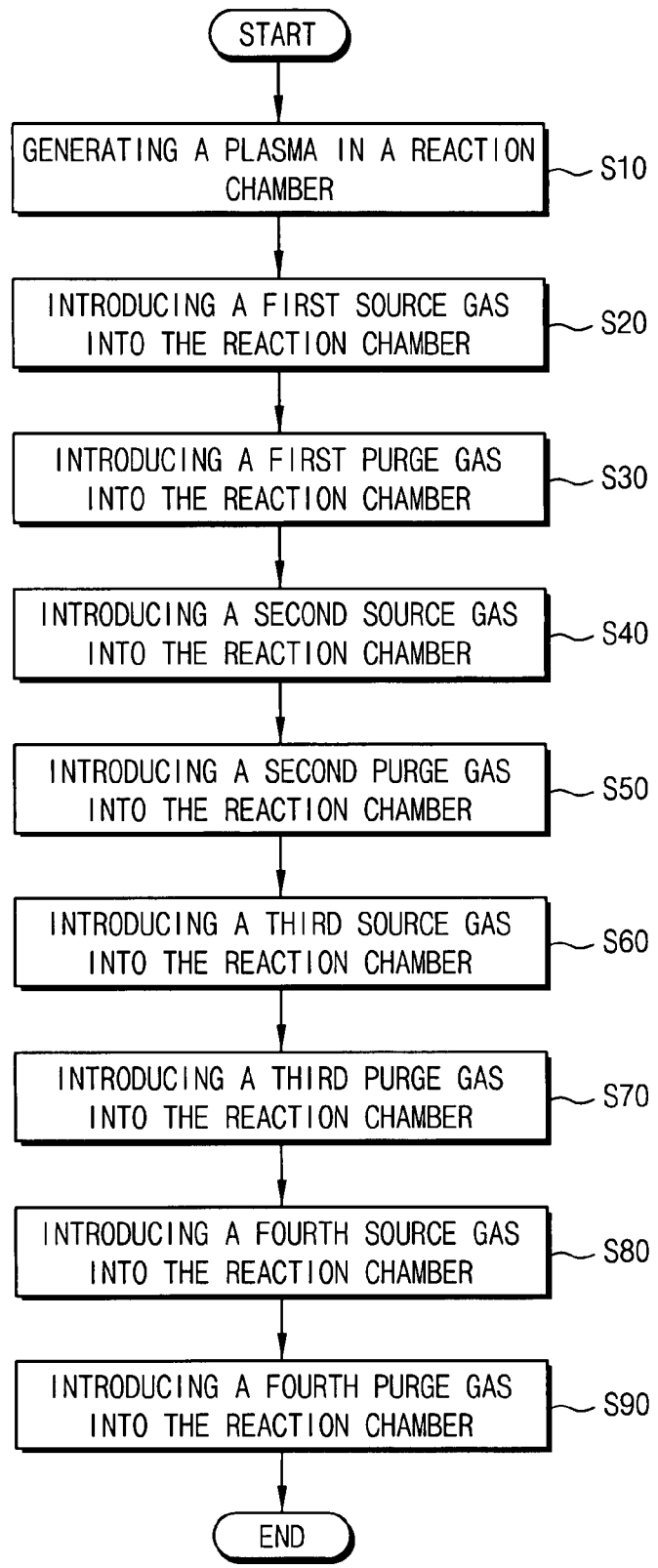
FIG. 1 is a flow chart illustrating an example method of forming a phase-change material layer.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon functionality and/or acts involved.

The present invention is described more fully hereinafter with reference to the accompanying drawings, in which embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
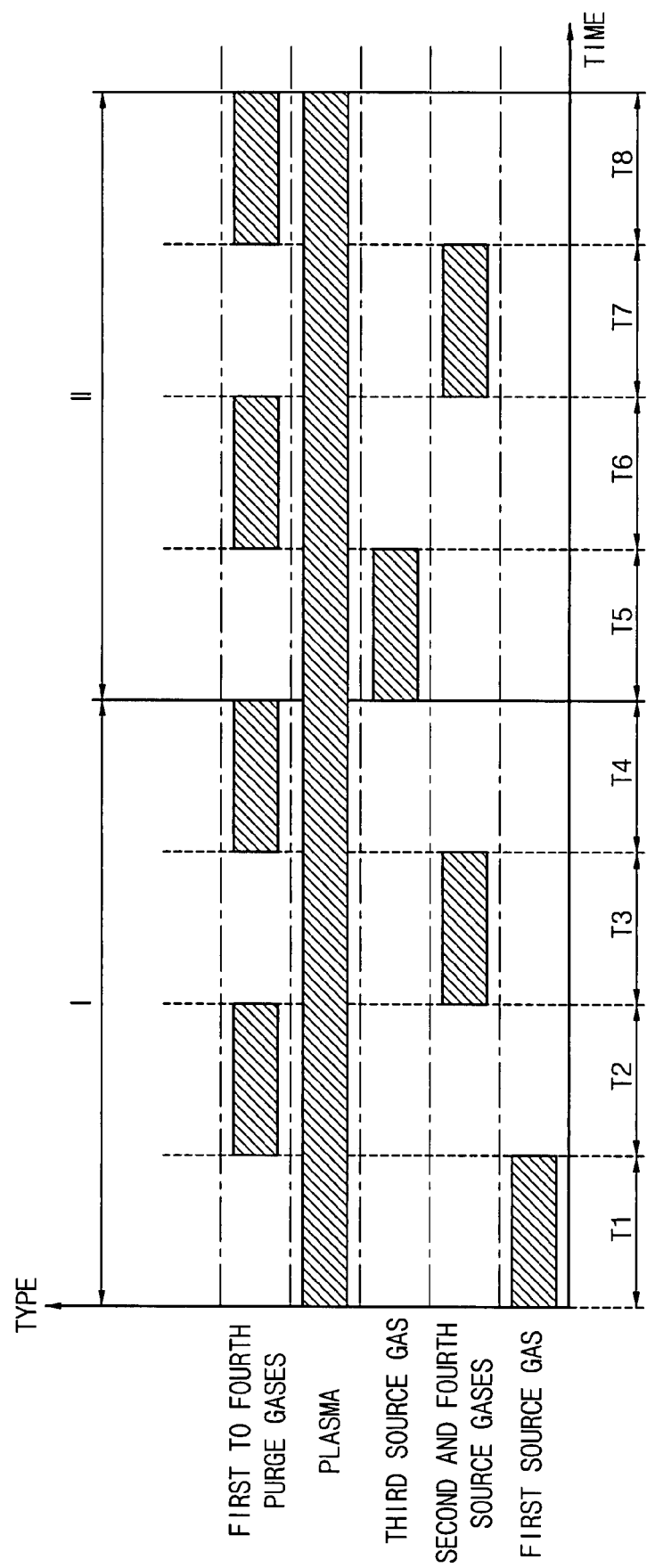
FIG. 2 is a timing diagram illustrating an example method of forming the phase-change material layer.

FIG. 1 is a flow chart illustrating an example method of forming a phase-change material layer, and FIG. 2 is a timing diagram illustrating the example method of forming the phase-change material layer in FIG. 1.

As shown in FIGS. 1 and 2, after loading an object into a reaction chamber, a plasma may be generated in the reaction chamber in step S10. A phase-change material layer may be formed on the object, which may be a semiconductor substrate such as a silicon substrate, a silicon-on-insulator (SOI) substrate, a single crystalline metal oxide substrate, and/or any suitable object. For example, the object may be a single crystalline aluminum oxide ($Al_2O_3$) substrate and/or a single crystalline strontium titanium oxide ($SrTiO_3$) substrate. The object may include an electrode, a conductive layer, a conductive pattern, an insulation layer, an insulation pattern, and/or any other suitable electronic component. The phase-change material layer may be formed to contact the object or may be formed to not contact the object by interposing the electrode, the conductive layer, the conductive pattern, the insulation layer, the insulation pattern, and/or any other component between the object and phase-change material layer.

In example embodiments, the plasma formed over the object may include a helium (He) plasma. In order to generate the helium plasma in the reaction chamber, a helium gas may be introduced into the reaction chamber at a flow rate of about 200 standard cubic centimeters per minute (sccm) to about 800 sccm. For example, the helium gas may be provided onto the object at a flow rate of about 300 sccm to about 500 sccm.

In example embodiments of the present invention, the plasma formed in the reaction chamber may include an argon (Ar) and helium plasma. An argon gas may be introduced into the reaction chamber at a flow rate of about 50 sccm to about 300 sccm to thereby generate the argon plasma over the object in the reaction chamber. Flow rate ratio between the helium gas and the argon gas may be in a range of 1:0.06 to about 1:1.5. For example, the flow rate ratio between the helium gas and the argon gas may be about 1:0.1 to about 1:1.

Helium/argon gas introduced to the reaction chamber may be pre-heated for about 30 to about 90 seconds and then stabilized for about 1 second to about 3 seconds. For example, the helium/argon gas may be pre-heated for about 60 seconds, and the pre-heated helium/argon gas may then be stabilized for about 2 seconds. A power of about 20 Watts to about 200 Watts may be applied to the stabilized helium/argon gas for about 5 to about 15 seconds, thereby generating the helium/argon plasma over the object in the reaction chamber. For example, a power of about 30 Watts to about 50 Watts may be applied to the stabilized helium/argon gas for about 10 seconds to generate the helium/argon plasma in the reaction chamber. The method illustrated in FIGS. 1 and 2 may be referred as a plasma-assisted chemical vapor deposition (CVD) method, in which a plasma is continuously applied in the reaction chamber during formation of various layers on an object. The helium/argon plasma may be continuously formed in the reaction chamber during formation of the phase-change material layer on the object.

A purge gas may be introduced into the reaction chamber after forming the helium/argon plasma in the reaction chamber. The purge gas may include a helium gas and/or an argon gas. The purge gas may remove remaining helium/argon plasma from the reaction chamber. The purge gas may be provided into the reaction chamber for about 1 second to about 3 seconds. For example, the purge gas may be introduced into the reaction chamber for about 2 seconds.

As illustrated in FIGS. 1 and 2, in step S20, the object may be exposed to a first source gas introduced into the reaction chamber including a first material for a first time T1 after forming the helium/argon plasma in the reaction chamber. The first source gas may be provided from a first source gas canister together with a first carrier gas. The first source gas canister may be kept at a room temperature.

The first carrier gas may include an inactive gas such as argon, nitrogen, and/or any noble gas. The first carrier gas may be introduced to the reaction chamber at a flow rate of about 50 sccm to about 200 sccm. For example, the flow rate of the first carrier gas may be in a range of about 100 sccm.

The first source gas including the first material may be introduced to the reaction chamber for the first time T1, which may be in a range of about 0.1 second to about 2 seconds. For example, the object may be exposed to the first source gas for about 1 second. The first material in the first source gas may be chemically absorbed, deposited, and/or chemisorbed onto the object under a relatively lower pressure of about 1 Torr to about 5 Torr by applying a power of about 20 Watts to about 200 Watts. For example, the first material may be chemisorbed on the object under a relatively lower pressure of about 3 Torr by applying a power of about 30 Watts to about 50 Watts. Because the first material in the first source gas may be chemisorbed on the object using the helium/argon plasma, the first material may be chemisorbed on the object at a low temperature of about 100° C. to about 300° C. For example, the first material in the first source gas may be chemisorbed onto the object at a lower temperature of about 200° C. In chemisorbing the first material onto the object, the reaction chamber may have a temperature of about 100° C. to about 200° C. For example, the reaction chamber may have a temperature of about 150° C. while chemisorbing the first material on the object.

The first material in the first source gas may include, for example, germanium (Ge) and/or Antimony (Sb). For example, the first material may include Ge(iso-Propane)$_3$H, GeCl$_4$, Ge(Methane)$_4$, Ge(Methane)$_4$N$_3$, Ge(Ethane)$_4$, Ge(Methane)$_3$N(Ethane)$_2$, Ge(iso-Butane$_3$)H, Ge(n-Butane)$_4$, Sb(GeEthane$_3$)$_3$, Ge(Cyclopropane)$_2$, and/or another suitable material. These materials may be used alone or in any combination. Table 1 shows types and characteristics of different materials that include germanium if used as the first material employed in example embodiments.

TABLE 1

(Values are approximate)

| Type | Melting Point [° C.] | Boiling Point [° C.] | Molecular Weight | Property |
|---|---|---|---|---|
| GeCl$_4$ | −49.5 | 83.1 | 214.40 | Sensitive to air/moisture |
| Ge(Me)$_4$ | −88.0 | 43.4 | 132.73 | Sensitive to air/moisture |
| Ge(Me)$_4$N$_3$ | −65.0 | 136.0 | 159.71 | Sensitive to air/moisture |
| Ge(Et)$_4$ | −90.0 | 165.0 | 188.84 | Sensitive to air/moisture |
| Ge(Me)$_3$NEt$_2$ | <10.0 | 138.0 | 189.82 | Sensitive to air/moisture |
| Sb(GeMe$_3$)$_3$ | 12.0 | — | 474.83 | Sensitive to air/moisture |
| Ge(i-Bu)4 | −73.0 | 225.0 | 301.05 | Sensitive to air/moisture |
| Sb(GeEt$_3$)$_3$ | <10.0 | 157.0 | 683.71 | Sensitive to air/moisture |
| Ge(Cp)$_2$ | 25.0< | — | 202.78 | Yellow solid |

If the first material in the first source gas includes germanium, the first material may be chemisorbed onto the object so that a germanium layer may be formed as a first material layer on the object. Similarly, if the first material in the first gas source includes antimony, the first material may be chemisorbed onto the object so that an antimony layer may be formed as the first material layer on the object.

As illustrated in FIGS. 1 and 2, in step S30, a first purge gas may be introduced into the reaction chamber for a second time T2 after forming the first material layer on the object. The first purge gas may be introduced into the reaction chamber for the second time T2, which may be in a range of about 0.1 second to about 2 seconds. The first purge gas may include an inactive gas such as argon, nitrogen, and/or another inert gas. For example, the first purge gas may be introduced into the reaction chamber for about 1.0 second. The first purge gas may be introduced into the reaction chamber at a flow rate of about 50 sccm to about 200 sccm. For example, the first purge gas may be introduced into the reaction chamber at a flow rate of about 100 sccm.

The first purge gas may remove any remaining, non-chemisorbed first material and first gas from the reaction chamber. For example, the first purge gas may remove a portion of the first material merely physically absorbed, or physisorbed, and not chemisorbed and may further remove any stray portion of the first material from the reaction chamber.

In step S40, the first material layer formed on the object may be exposed to a second source gas introduced into the reaction chamber including a second material for about a third time T3 after providing the first purge gas. The second source gas may be provided from a second source gas canister. The second source gas canister may have a temperature of about 30° C. to about 40° C. The second source gas may be introduced with a second carrier gas. The second carrier gas may be introduced into the reaction chamber at a flow rate of about 50 sccm to about 200 sccm. For example, the second carrier gas may be introduced into the reaction chamber at a flow rate of about 100 sccm. The second carrier gas may include, for example, an argon gas and/or another inert gas.

The second material in the second source gas may include tellurium (Te). The second source gas may be introduced and flow for the third time T3, which may be in a range of about 0.1 second to about 1 second. For example, the third time T3 may be about 0.4 to about 0.8 seconds. Examples of the second material may include Te(iso-Butane)$_2$, TeCl$_4$, Te(Methane)$_2$, Te(Ethane)$_2$, Te(n-Propane)$_2$, Te(iso-Propane)$_2$, Te(t-Butane)$_2$, and/or another suitable material. These materials may be used alone or in any combination. Table 2 shows types and characteristics of different materials that include tellurium if used as the first material employed in example embodiments.

TABLE 2

(Values are approximate)

| Type | Melting Point [° C.] | Boiling Point [° C.] | Molecular Weight |
|---|---|---|---|
| TeCl$_4$ | −224 | 380 | 269.41 |
| Te(Me)$_2$ | −10 | — | 157.68 |
| Te(Et)$_2$ | — | — | 185.72 |
| Te(nPr)$_2$ | — | — | 213.77 |
| Te(tBu)$_2$ | — | — | 241.83 |
| Te(iPr)$_2$ | — | — | 213.77 |

The second material in the second source gas may chemically react with the first material layer at a relatively lower temperature of about 100° C. to about 300° C. and a relatively lower pressure of about 1 Torr to about 5 Torr. A first composite material layer including the first material and the second material may be formed on the object due to the reaction between the second material and the first material layer.

The first composite material layer may further include carbon by providing an additional source gas including carbon together with the second source gas. Alternatively, an organic ligand included in the first material and/or the second material may correspond to carbon included in the first composite material layer.

When the second material chemically reacts with the first material layer, a power of about 20 Watts to about 200 Watts may be applied to the reaction chamber. For example, the first composite material layer may be formed by applying a power of about 20 Watts to about 50 Watts.

If the first material includes germanium and the second material contains tellurium, the first composite material layer may include germanium-tellurium (Ge—Te) by a chemical reaction between tellurium in the second material and germanium in the first material. Thus, the first composite material layer including the first and the second materials may correspond to a germanium-tellurium layer. Alternatively, the first composite material may correspond to a carbon-containing germanium-tellurium layer.

The first time T1 of the first source gas and the third time T3 of the second source gas may be adjusted to control concentration ratio of germanium and tellurium in the first composite material layer. A concentration ratio between germanium and tellurium included in the first composite material layer may be controlled by the flow rate of the helium gas that forms the helium plasma in the reaction chamber.

As illustrated in FIGS. 1 and 2, in step S50, a second purge gas may be introduced into the reaction chamber for a fourth time T4 after forming the first composite material layer on the object. The second purge gas may be provided into the reaction chamber for the fourth time T4, which may be in a range of about 0.1 second to about 2 seconds. For example, the second purge gas including an argon gas and/or a helium gas may be introduced into the reaction chamber for about 1 second. The second purge gas may be introduced into the reaction chamber at a flow rate of about 50 sccm to about 200 sccm. For example, the second purge gas may be provided into the reaction chamber at a flow rate of about 100 sccm.

The second purge gas may remove non-reacted second material from the reaction chamber. That is, the second purge gas may remove any of the second material that is not chemically reacted with the first material layer.

In step S60, a third source gas including a third material may be introduced to the reaction chamber for a fifth time T5 after introducing the second purge gas to the reaction chamber. The first composite material layer may be exposed to the third source gas, which may be supplied from a third source gas canister together with a third carrier gas. The third source gas canister may have a temperature of about 30° C. to about 50° C. The third carrier gas may include an inactive gas such as argon, nitrogen, and/or another inert gas. The third carrier gas may flow into the reaction chamber at a flow rate of about 50 sccm to about 200 sccm. For example, the third carrier gas may flow into the reaction chamber at a flow rate of about 100 sccm.

The first composite material layer may be exposed to the third source gas for the fifth time T5, which may be in a range of about 0.1 second to about 2 seconds, thereby forming a third material layer on the first composite material layer. For example, the third source gas may be introduced into the reaction chamber for about 0.4 to about 0.8 seconds. Additionally, the third material layer may be formed on the first composite material layer at a relatively lower pressure of about 1 Torr to about 5 Torr by applying a power of about 20 Watts to about 200 Watts. For example, the third material layer may be formed on the first composite material layer under a relatively lower pressure of about 3 Torr by applying a power of about 30 Watts to about 50 Watts.

As described above, because the third material may chemically react with the first composite material layer using the helium/argon plasma, the third material layer may be formed on the first composite material layer at a relatively lower temperature of about 100° C. to about 300° C. For example, the third material layer may be formed on the first composite material layer at a relatively lower temperature of about 200° C. During formation of the third material layer, the reaction chamber may have a temperature of about 100° C. to about 200° C. For example, the interior of the reaction chamber may have a temperature of about 150° C.

The third material in the third source gas may include antimony (Sb). For example, the third material may include $Sb(iso\text{-}Butane)_3$, $SbCl_3$, $SbCl_5$, $Sb(Methane)_3$, $Sb(Ethane)_3$, $Sb(n\text{-}Propane)_3$, $Sb(t\text{-}Butane)_3$, $Sb[N(Methane)_2]_3$, $Sb(Cyclopropane)_3$, and/or another suitable antimony material. These materials may be used alone or any combination. The following Table 3 shows approximate types and characteristics of different materials that may include antimony and may be used as the third material in the present embodiment.

TABLE 3

(Values approximate)

| Type | Melting Point [° C.] | Boiling Point [° C.] | Molecular Weight | Property |
|---|---|---|---|---|
| $SbCl_3$ | 73.4 | 283 | 228.11 | — |
| $SbCl_5$ | 2.8 | 79 | 299.02 | — |
| $Sb(Me)_3$ | −87.6 | 80.6 | 166.86 | Pyrophoric |
| $Sb(Et)_3$ | — | 156 | 208.94 | Pyrophoric |
| $Sb(nPr)_3$ | — | 100 | 251.02 | Pyrophoric |
| $Sb(tBu)_3$ | <10 | 102 | 293.10 | Sensitive to air/moisture |
| $Sb[N(Me)_2]_3$ | — | 32 | 253.99 | Sensitive to air/moisture |
| $Sb(Cp)_3$ | 56 | — | — | Sensitive to air/moisture |

If the third material in the third source gas includes antimony, the third material layer formed on the first composite material layer may be an antimony layer. Alternatively, if the first material and the third material include antimony and germanium, respectively, the third material in the third source gas may include germanium, and the third material layer may be a germanium layer.

As illustrated in FIGS. 1 and 2, in step S70, a third purge gas may be introduced to the reaction chamber for a sixth time T6 after forming the third material layer on the first composite material layer. The third purge gas may flow into the reaction chamber for the sixth time T6, which may be in a range of about 0.1 second to about 2 seconds. For example, the third purge gas including an argon and/or helium gas may be flow into the reaction chamber for about 1 second. The third purge gas may flow into the reaction chamber at a flow rate of about 50 sccm to about 200 sccm. For example, the third purge gas may flow into the reaction chamber at a flow rate of about 100 sccm. The third purge gas may remove any non-chemisorbed third material from the reaction chamber. That is, the third purge gas may purge any excess portion of the third material that has not chemically reacted with the first composite material layer.

In step S80, the third material layer may be exposed to a fourth source gas including a fourth material introduced into the reaction chamber for a seventh time T7 after purging the reaction chamber using the third purge gas. The fourth material in the fourth source gas may include tellurium. Examples of the fourth material may include $Te(iso\text{-}Butane)_2$, $TeCl_4$, Te(Methane)$_2$, Te(Ethane)$_2$, Te(n-Propane)$_2$, Te(iso-Propane)$_2$, Te(t-Butane)$_2$, and/or another tellurium material. These materials may be used alone or in any combination. The fourth source gas may be provided from a fourth source gas canister having a temperature of about 30° C. to about 40° C. The second and the fourth source gases may be provided from the same source gas canister. The fourth source gas may be fed into the reaction chamber together with a fourth carrier gas. The fourth carrier gas may be introduced into the reaction chamber at a flow rate of about 50 sccm to about 200 sccm. For example, the fourth carrier gas including, for example, an argon gas may be introduced into the reaction chamber at a flow rate of about 100 sccm.

The third material layer may be exposed to the fourth source gas for the seventh time T7, which may be in a range of about 0.1 second to about 1 second. For example, the fourth source gas including the fourth material may be introduced into the reaction chamber for about 0.4 to about 0.8 seconds. The fourth material may chemically react with the third material layer at a relatively lower temperature of about 100° C. to about 300° C. and a relatively lower pressure of about 1 Torr to about 5 Torr, and a second composite material layer including the third and/or the fourth materials may be formed on the first composite material layer. During formation of the second composite material layer, a power of about 20 Watts to about 200 Watts may be applied to the reaction chamber. For example, the second composite material layer may be formed on the first composite material layer by applying a power of about 30 Watts to about 50 Watts.

When the third material includes antimony and the fourth material includes tellurium, the second composite material layer may include antimony-tellurium due to a chemical reaction between antimony in the third material layer and tellurium in the fourth source gas. Alternatively, the second composite material layer may include carbon substantially similar to the first composite material layer. The second composite material layer may be a carbon-containing antimony-tellurium layer. The phase-change material layer including germanium-antimony-tellurium and/or carbon-containing germanium-antimony-tellurium may thus be formed on an object.

In example methods, the concentration of antimony and/or tellurium in the second composite material layer may be easily adjusted by controlling the fifth time T5 of the third source gas and/or the seventh time T7 of the fourth source gas. Additionally, carbon concentration in the second composite material layer may be adjusted by controlling the flow rate of the helium gas for forming the helium plasma.

The phase-change material layer may include, for example, about 1 to about 6 percent by weight of carbon, about 15 to about 30 percent by weight of germanium, about 15 to about 25 percent by weight of antimony, and about 39 to about 69 percent by weight of tellurium.

As illustrated in FIGS. 1 and 2, in step S90, a fourth purge gas may be introduced into the reaction chamber for an eighth time T8 after forming the phase-change material layer on the object. The fourth purge gas may be introduced into the reaction chamber for the eighth time T8, which may be in a range of about 0.1 second to about 2 seconds. For example, the fourth purge gas including, for example, an argon gas, may flow into the reaction chamber for about 1 second. The fourth purge gas may flow into the reaction chamber at a flow rate of about 50 sccm to about 200 sccm. For example, the fourth purge gas may flow into the reaction chamber at a flow rate of about 100 sccm. The fourth purge gas may remove any remaining non-reacted fourth material from the reaction chamber. For example, the fourth gas may purge a portion of the fourth material that has not chemically reacted with the third material layer.

It should be understood that this description is for illustration purposes, and is not intended to limit the scope of the present general inventive concept. The materials including germanium, antimony, and tellurium may be applied in other orders and/or sequences. For example, a material including antimony may be applied first, a material including tellurium second, a material including germanium third, and the material including tellurium fourth. Other orders may also be used.

Germanium, tellurium, and antimony concentration ratios in the phase-change material layer containing carbon may be adjusted by controlling the feeding time T1 of the first source gas, the feeding time T3 of the second source gas, the feeding time T5 of the third source gas, and/or the feeding time T7 of the fourth source gas. Further, carbon content of the phase-change material layer may be controlled by adjusting the flow rate of the helium gas for the helium plasma and/or the pressure for generating the helium plasma. For example, carbon content of the phase-change material layer may increase if the flow rate of the helium gas for the helium plasma increases. A carbon content of the phase-change material layer may decrease if the pressure for forming the helium plasma increases.

The carbon-containing phase-change material layer may include germanium, antimony, and tellurium at a concentration ratio of about 2:2:5 if the feeding time of the source gas including antimony is about 0.6 to about 0.8 seconds and the feeding time of the source gas including tellurium is about 0.6 to about 0.8 seconds. If the carbon-containing phase-change material layer has about a 2:2:5 concentration ratio among germanium, antimony, and tellurium, the phase-change material layer may have a FCC crystalline structure and/or improved electrical characteristics. The carbon-containing phase-change material layer may also undergo phase transition if the carbon-containing phase-change material layer includes germanium, antimony, and tellurium in a concentration ratio of about 2:2:5.

Figure 3:
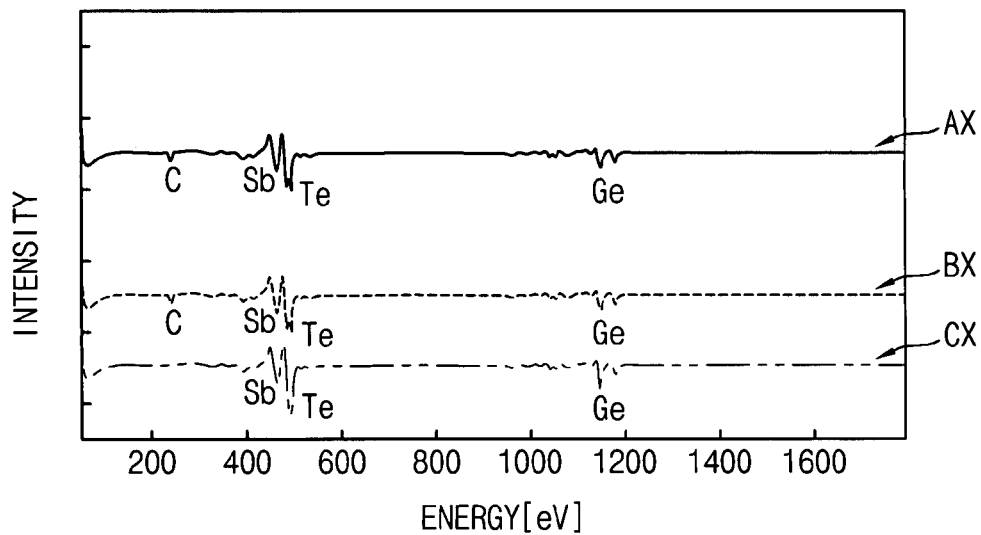
FIG. 3 is a graph illustrating content peaks in three different example embodiment phase-change material layers formed by differing flow rates of helium gas and pressures for forming a helium plasma.

FIG. 3 is a graph illustrating content peaks in three different phase-change material layers formed by differing flow rates of helium gas and pressures for forming a helium plasma. In FIG. 3, "AX" indicates content peaks of carbon, germanium, antimony and tellurium in a first phase-change material layer formed under process conditions including a pressure of about 2 Torr, a flow rate of a helium gas of about 600 sccm, and a power of about 30 Watts. "BX" represents content peaks of carbon, germanium, antimony, and tellurium in a second phase-change material layer formed under process conditions including a pressure of about 3 Torr, a flow rate of a helium gas of about 500 sccm, and a power of about 30 Watts. "CX" denotes content peaks of carbon, germanium, antimony, and tellurium in a third phase-change material layer formed under process conditions including a pressure of about 2 Torr, a flow rate of a hydrogen gas of about 500 sccm, and a power of about 30 Watts.

As illustrated in FIG. 3, the first and the second phase-change material layers AX and BX may include above 2 percent by weight of carbon if the first and the second phase-change material layers are formed using helium plasmas. However, the third phase-change material layer CX may not include carbon because the third phase-change material layer is formed using a hydrogen plasma. The first phase-change material layer may include about 2.91 percent by weight of carbon, and the second phase-change material layer may include about 2.69 percent by weight of carbon. Thus, the content of carbon in the phase-change material layer may increase as the flow rate of the helium gas increases, whereas pressure for forming the helium plasma decreases. If carbon content of the phase-change material layer increases, the phase-change material layer may have improved set resistance.

As described above, example embodiment phase-change material layers including the first and the second composite material layers may be formed on the object using example methods described with reference to FIGS. 1 and 2. As illustrated in FIG. 2, the phase-change material layer may achieve a thickness and adjusted concentration ratio by repeating a first unit process I to form the first composite material layer and a second unit process II to form the second composite material layer. For example, if the first unit process I and the second unit process II are alternately repeated about fifty times, example embodiment phase-change material layers may have a thickness of about 1,000 Å.

The first unit process I and the second unit process II may be alternately repeated. Alternatively, more than one first unit process I and/or more than one second unit process II may be alternately repeated. For example, the first unit process I, the second unit process II the first unit process I, and/or the second unit process II may be sequentially executed. In other example methods, the first unit process I, the first unit process I, the second unit process II, the first unit process I, the first unit process I, and the second unit process II may be sequentially executed. In further example methods, the second unit process II, the first unit process I, the second unit process II, and the first unit process I may be sequentially executed. Alternatively, for example, the second unit process II, the second unit process II, the first unit process I, the second unit process II, the second unit process II, and the first unit process I may be sequentially executed. Other sequences of the first and second unit processes I and II may also be performed.

The phase-change material layer may have a crystalline structure that may be different from that of the conventional phase-change material layer.

Example embodiment phase-change material layers formed through the above-described example method may include about 1 to about 6 percent by weight of carbon, about 15 to about 30 percent by weight of germanium, about 15 to about 25 percent by weight of antimony, and about 39 to about 69 percent by weight of tellurium. Example embodiment phase-change material layers having this composition may have a crystalline structure different from that of related art phase-change material layer. Example embodiment phase-change material layers may have a reduced reset current and/or a decreased set current.

Figure 4:
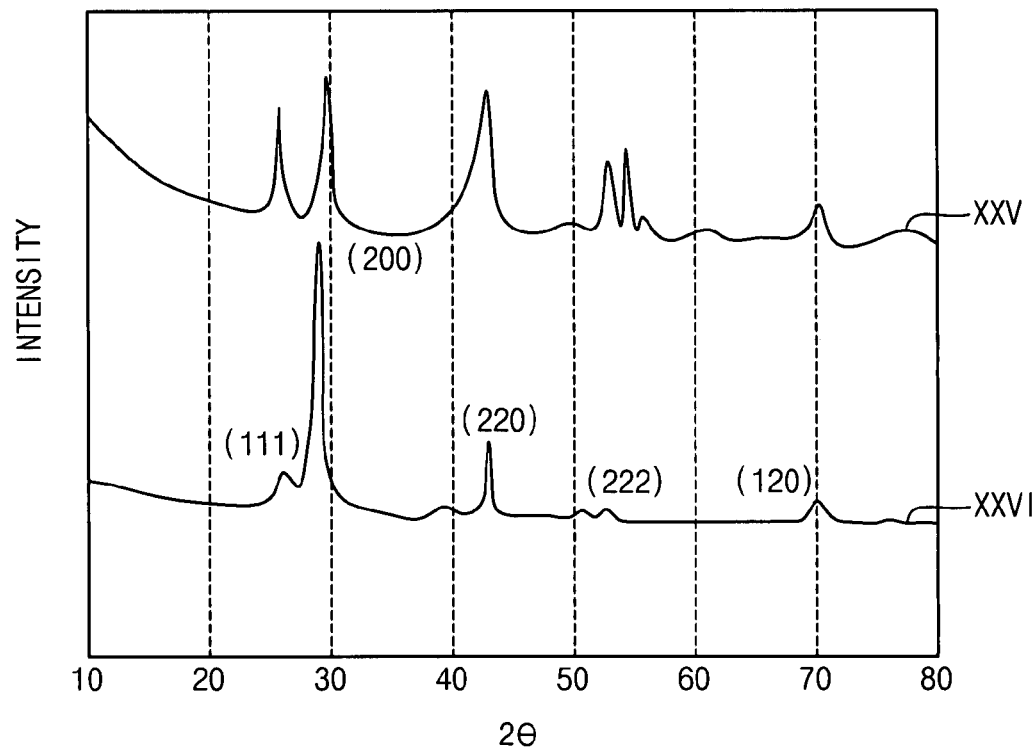
FIG. 4 is a graph comparing crystalline structures of related art phase-change material layers and phase-change material layers in example embodiments.

FIG. 4 is a graph contrasting crystalline structures of related art phase-change material layers and example embodiment phase-change material layers. In FIG. 4, the crystalline structures of the phase-change material layers may be detected using an X-Ray diffractometer. In FIG. 4, "XXV" represents the crystalline structure of related art phase-change material layer, and "XXVI" indicates the crystalline structure of example embodiment phase-change material layers.

As illustrated in FIG. 4, example embodiment phase-change material layer XXVI may have a crystalline structure that includes a dominant FCC structure, which may be grown along a (200) plane. FCC structures grown along a (200) plane may not be dominant in related art phase-change material layers XXV. Example embodiment phase-change material layers XXVI may include uniformly grown minute grains to provide improved electrical characteristics. Uniform grains in example embodiment phase-change material layer XXVI may have a denser structure so as to not cause a contact failure in an electrode. For example, the minute grains in example embodiment phase-change material layer XXVI may have sizes in a range of about 2 nm to about 15 nm.

Analysis of Crystalline Structures of Phase-Change Material Layers

The following example embodiment phase-change material layers were subjected to various experiments with results detailed below.

EXAMPLES 1-4

Four different plasmas generated by example process conditions shown in the following Table 4 were used to create each of Examples 1-4, in which a substrate was exposed to a first source gas including germanium for about 1.0 second. Then the substrate was exposed to a second source gas including tellurium for about 0.2 seconds to form a first composite material layer on the substrate in accordance with example methods.

The first composite material layer was then exposed to a third source gas including antimony for about 0.4 seconds, and then the first composite layer was exposed to a fourth source gas including tellurium for about 0.2 seconds, forming a second composite layer. In accordance with example methods, a carbon-containing phase-change material layer including germanium, antimony and tellurium was formed on the substrate.

TABLE 4

| | Flow Rate of Gas for a Plasma | | Pressure | RF Power |
|---|---|---|---|---|
| | Ar [sccm] | He [sccm] | [Torr] | [W] |
| Example 1 | 300 | 0 | 3 | 30 |
| Example 2 | 250 | 100 | 3 | 30 |
| Example 3 | 150 | 300 | 3 | 30 |
| Example 4 | 50 | 500 | 3 | 30 |

Figure 5:
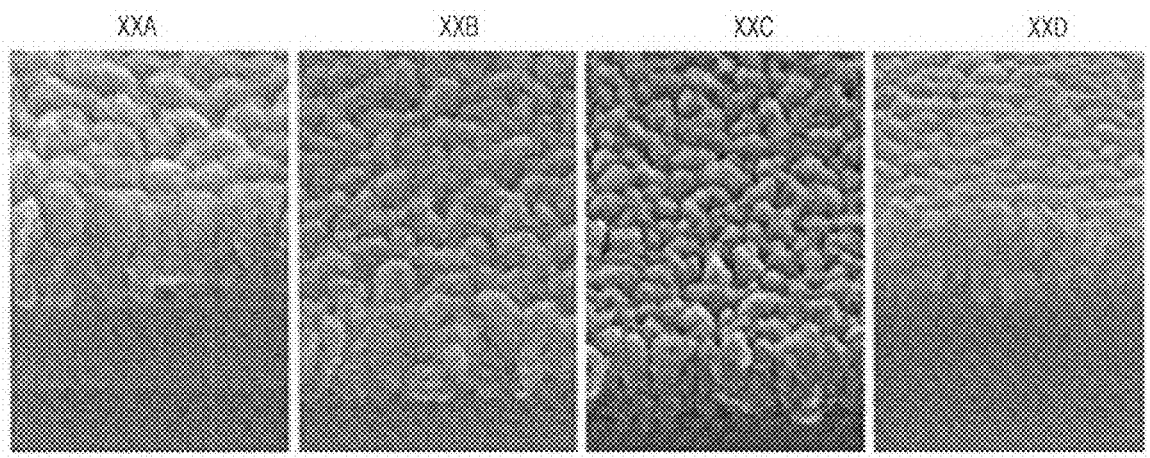
FIG. 5 illustrates electron microscopic pictures showing plan crystalline structures of carbon-containing phase-change material layers according to example embodiments.
Figure 6:
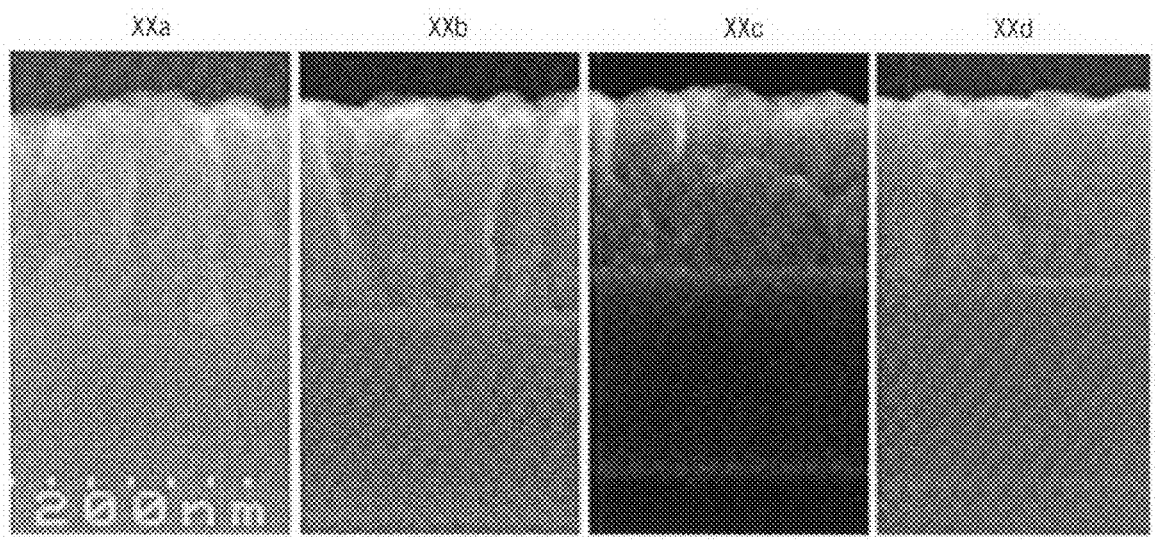
FIG. 6 illustrates electron microscopic pictures showing cross-sectional crystalline structures of carbon-containing phase-change material layers in example embodiments.

FIG. 5 illustrates electron microscope images of crystalline structures of carbon-containing phase-change material layers in Examples 1 to 4. FIG. 6 illustrates electron microscope images of cross-sectional crystalline structures of the carbon-containing phase-change material layers in Examples 1 to 4. In FIG. 5, "XXA," "XXB," "XXC" and "XXD" indicate the plan crystalline structures of carbon-containing phase-change material layers in Examples 1, 2, 3, and 4, respectively. In FIG. 6, "XXa," "XXb," "XXc" and "XXd" represent the cross-sectional crystalline structures of carbon-containing phase-change material layers in Examples 1, 2, 3 and 4, respectively.

As illustrated in FIGS. 5 and 6, the carbon-containing phase-change material in Examples 3 and 4 may include uniformly grown minute grains and/or have uniform surfaces because the flow rate of the helium gas may be larger than that of the argon gas to allow improved electrical characteristics. If the flow rate of the argon gas is larger than that of the helium gas, the carbon-containing phase-change material layers shown in Examples 1 and 2 may not have uniform minute grains and/or uniform surfaces, and their electrical characteristics may not be improved. Example embodiment carbon-containing phase-change material layers may have an increasingly uniform surface and/or uniformly grown minute grains as the flow rate of the helium gas for forming the plasma increases.

Figure 7:
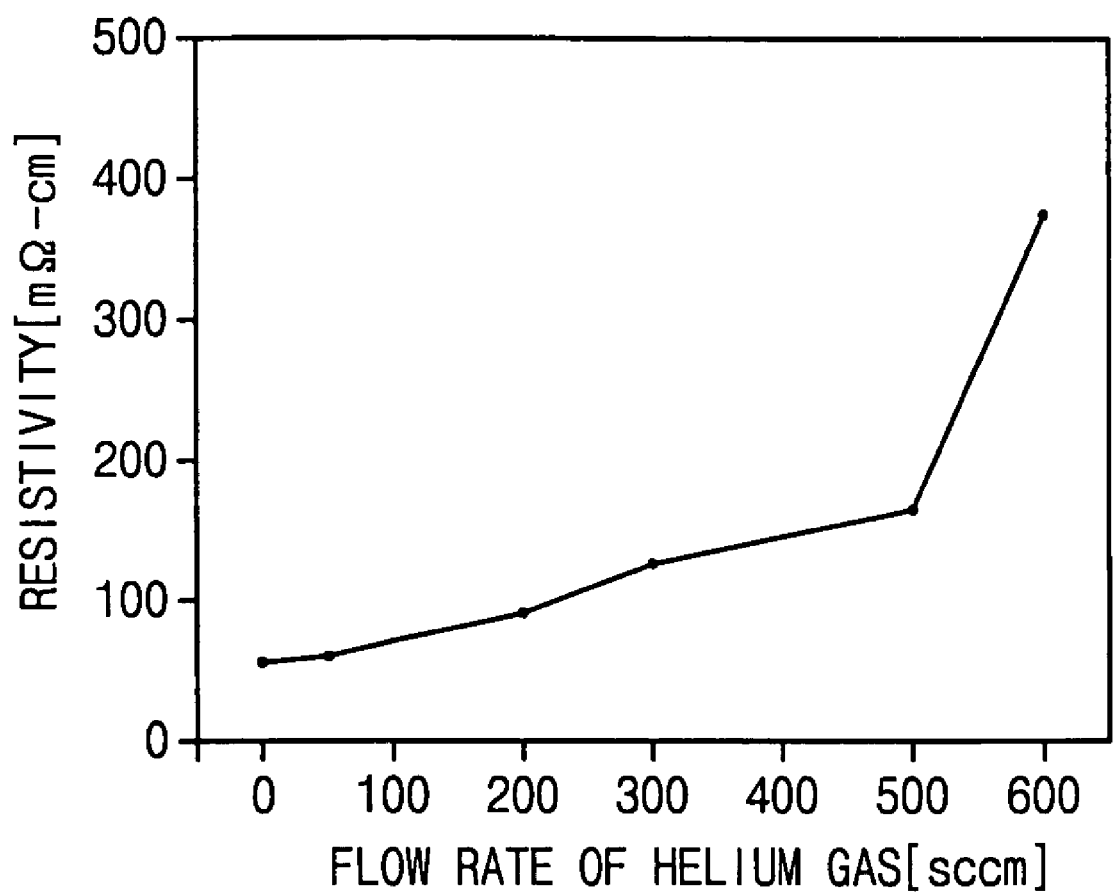
FIG. 7 is a graph illustrating resistances of the carbon-containing phase-change material layers versus flow rate of Helium in example embodiments.

FIG. 7 is a graph illustrating resistances of the carbon-containing phase-change material layers in Examples 1 to 4.

As illustrated in FIG. 7, the carbon-containing phase-change material layers in Examples 1 and 2 have resistances below about 60 mΩ-cm, whereas the carbon-containing phase-change material layers according to Examples 3 and 4 have resistivity above about 100 mΩ-cm. That is, a carbon-containing phase-change material layer may have an increased resistivity as flow rate of helium gas increases because of an increase in carbon content in the carbon-containing phase-change material layer.

EXAMPLES 5 to 8

In accordance with example methods, Examples 5 to 8 discussed below were formed by conditions detailed in Table 5 below by generating a plasma over a substrate under process conditions shown in the following Table 5, the substrate was exposed to a first source gas including germanium for about 1 second. Then the substrate was exposed to a second source gas including tellurium for about 0.2 seconds to form a first composite material layer on the substrate.

The first composite layer was exposed to a third source gas including antimony was for about 0.4 seconds, and then a second composite material layer was formed on the substrate by a fourth source gas including tellurium exposed to the substrate for about 0.2 seconds. An example embodiment carbon-containing phase-change material layer including germanium, antimony, and tellurium was thus formed on the substrate.

TABLE 5

(values are approximate)

| | Flow Rate of Gas for a Plasma | | Pressure | RF Power |
|---|---|---|---|---|
| | Ar [sccm] | He [sccm] | [Torr] | [W] |
| Example 5 | 50 | 500 | 2 | 30 |
| Example 6 | 50 | 500 | 3 | 30 |
| Example 7 | 50 | 500 | 4 | 30 |
| Example 8 | 50 | 500 | 5 | 30 |

Figure 8:
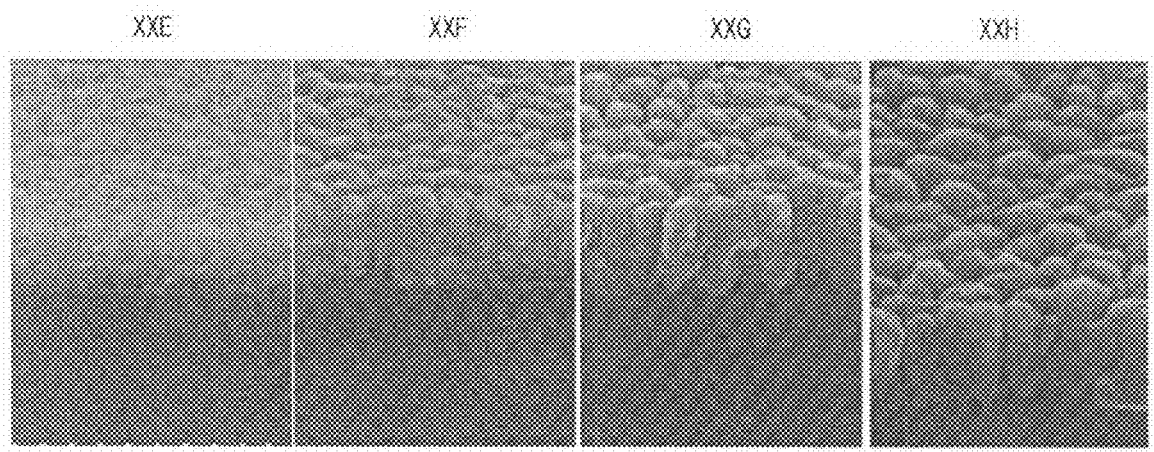
FIG. 8 illustrates electron microscopic pictures showing plan crystalline structures of carbon-containing phase-change material layers of further example embodiments.
Figure 9:
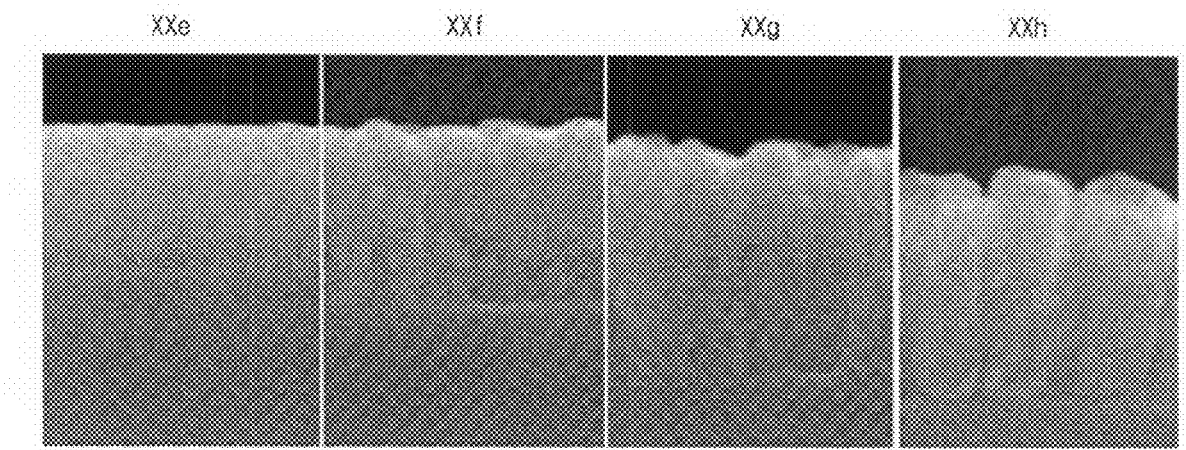
FIG. 9 illustrates electron microscopic pictures showing cross-sectional crystalline structures of the carbon-containing phase-change material layers of further example embodiments.

FIG. 8 shows electron microscope pictures of plan crystalline structures of carbon-containing phase-change material layers of Examples 5 to 8. FIG. 9 shows electron microscope pictures of cross-sectional crystalline structures of the carbon-containing phase-change material layers in Examples 5 to 8.

In FIG. 8, "XXE," "XXF," "XXG" and "XXH" show the plan crystalline structures of carbon-containing phase-change material layers in Examples 5-8, respectively. In FIG. 9, "XXe," "XXf," "XXg" and "XXh" show the cross-sectional crystalline structures of carbon-containing phase-change material layers in Examples 5-8, respectively.

As illustrated in FIGS. 8 and 9, the carbon-containing phase-change material layers in Examples 5 and 6 may have uniform surfaces and/or include uniformly grown minute grains because the pressure is relatively lower. If pressure for forming the plasma is relatively higher, the carbon-containing phase-change material layers shown in Examples 7 and 8 may not have uniform minute grains and/or uniform surfaces, and may have inferior electrical characteristics. A carbon-containing phase-change material layer may have a uniform surface and/or uniformly grown minute grains if the carbon-containing phase-change material layer is formed at a relatively lower pressure.

Figure 10:
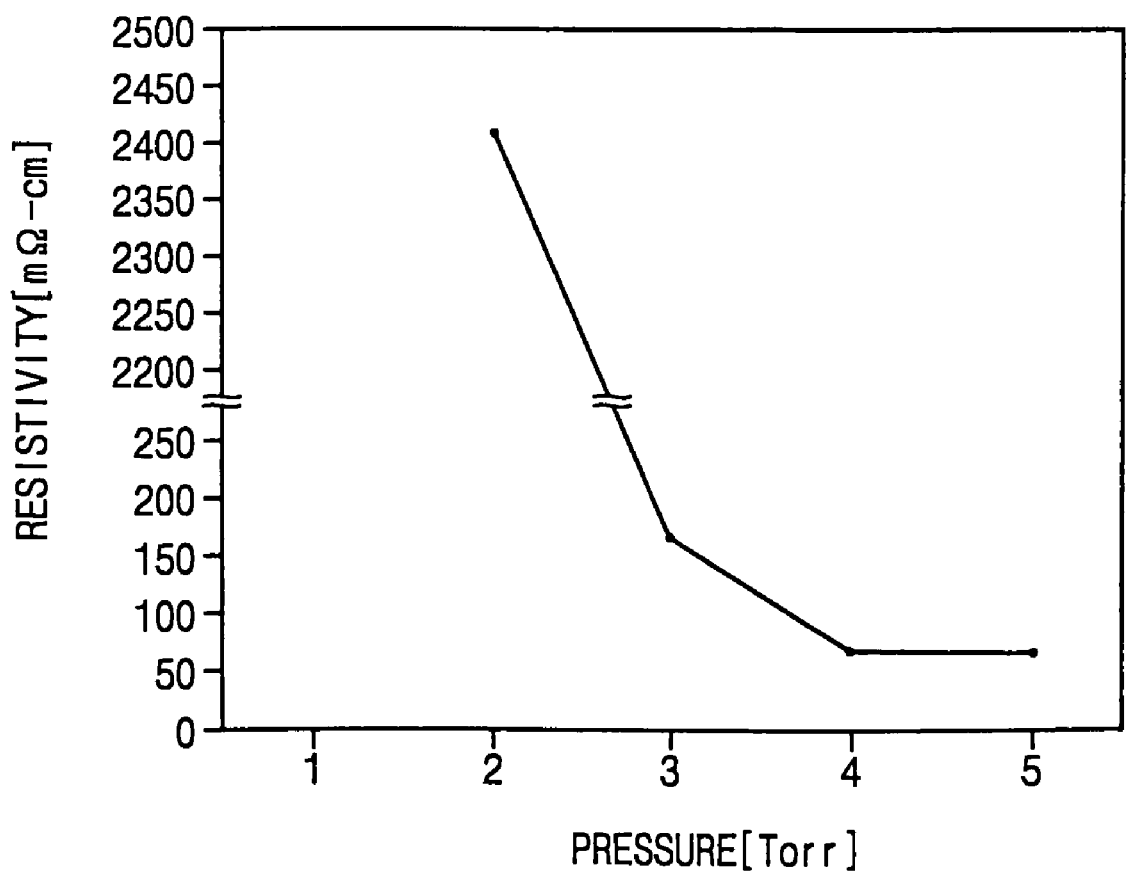
FIG. 10 is a graph illustrating resistances of the carbon-containing phase-change material layers versus pressure in further example embodiments.

FIG. 10 is a graph illustrating resistivity of the carbon-containing phase-change material layers in Examples 5 to 8.

As illustrated in FIG. 10, the carbon-containing phase-change material layers in Examples 7 and 8 have resistivity below about 60 mΩ-cm, whereas the carbon-containing phase-change material layers in Examples 5 and 6 have resistivity above about 100 mΩ-cm. Hence, a carbon-containing phase-change material layer may have an increased resistance if the carbon-containing phase-change material layer is formed at a low pressure. That is, carbon content in the carbon-containing phase-change material layer may increase when the carbon-containing phase-change material layer is formed at the relatively lower pressure.

FIGS. 11 to 18 are cross-sectional views illustrating an example method of manufacturing a phase-change memory device including the example phase change layer described above.

Figure 11:
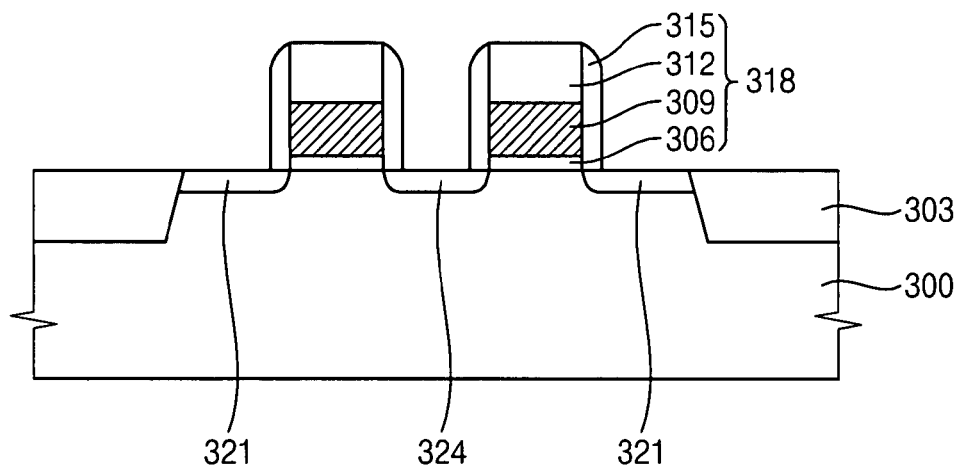
FIGS. 11 to 18 are cross-sectional views illustrating example methods of manufacturing a phase-change memory device.

As illustrated in FIG. 11, an isolation layer 303 may be formed on a semiconductor substrate 300 to define an active region and a field region. The isolation layer 303 may be formed by an isolation process such as a shallow trench isolation (STI) process, a thermal oxidation process, and/or another suitable process. For example, the isolation layer 303 may be formed using an oxide such as silicon oxide.

A gate insulation layer (not illustrated), a gate conductive layer (not illustrated), and/or a gate mask layer (not illustrated) may be sequentially formed on the active region of the semiconductor substrate 300. The gate insulation layer may be formed using an oxide and/or a metal oxide having a higher dielectric constant. For example, the gate insulation layer may be formed using silicon oxide, hafnium oxide, zirconium oxide, titanium oxide, titanium oxide, tantalum oxide, aluminum oxide, and/or another suitable material. The gate insulation layer may be formed by a thermal oxidation process, a CVD process, a PECVD process, an ALD process, an HDP-CVD process, and/or any other suitable process.

The gate conductive layer may be formed using doped polysilicon, a metal, and/or a metal silicide. For example, the gate conductive layer may be formed using tungsten, aluminum, titanium, tantalum, tungsten silicide, titanium silicide, cobalt silicide, and/or another suitable material. The gate conductive layer may be formed by a CVD process, a PECVD process, an ALD process, a sputtering process, and/or another suitable process.

The gate mask layer may be formed using a material that may have an etching selectivity relative to the gate conductive layer and/or the gate insulation layer. For example, the gate mask layer may be formed using silicon nitride, silicon oxynitride, and/or titanium oxynitride. The gate mask layer may be formed by a CVD process, a PECVD process, a sputtering process, an ALD process, and/or another suitable method.

The gate mask layer, the gate conductive layer, and/or the gate insulation layer may be patterned to form a gate insulation layer pattern 306, a gate electrode 309, and a gate mask 312 on the semiconductor substrate 300.

A first insulation layer (not illustrated) may be formed on the semiconductor substrate 300 to cover the gate mask 312. The first insulation layer may be anisotropically etched to form a gate spacer 315 on sidewalls of the gate insulation layer pattern 306, the gate electrode 309, and/or the gate mask 312. The gate structure 318 may include the gate insulation layer pattern 306, the gate electrode 309, the gate mask 312, and/or the gate spacer 315.

A first contact region 321 and/or a second contact region 324 may be formed in portions of the semiconductor substrate 300 adjacent to the gate structures 318 by an ion implantation process using the gate structure 318 as an ion implantation mask. A transistor including the first contact region 321, the second contact region 324, and the gate structure 318 may thus be formed on the semiconductor substrate 300. For example, the first and the second contact regions 321 and 324 may correspond to source/drain regions of the transistors, respectively.

Figure 12:
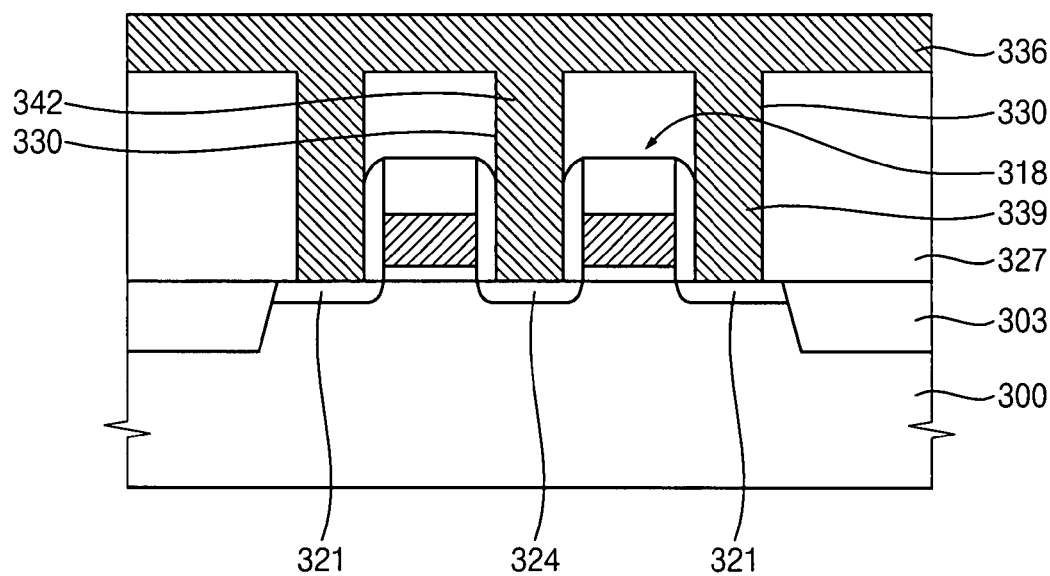

As shown in FIG. 12, a first insulating interlayer 327 may be formed on the semiconductor substrate 300 to cover the transistor. The first insulating interlayer 327 may be formed using an oxide such as PSG, BPSG, USG, SOG, TEOS, PE-TEOS, FOX, HDP-CVD oxide, and/or any suitable oxide. The first insulating interlayer 327 may be formed by a CVD process, a PECVD process, an ALD process, an HDP-CVD process, and/or any suitable process.

The first insulating interlayer 327 may be partially etched by a photolithography process or the like so that first and second lower contact holes 330 may be formed through the first insulating interlayer 327. The first and the second lower contact holes 330 may expose the first and the second contact regions 321 and 324, respectively.

A first conductive layer 336 may be formed on the first insulating interlayer 327 to fill up the first and the second lower contact holes 330. The first conductive layer 336 may be formed using doped polysilicon, a metal, a conductive metal nitride, and/or another conductive material. The first conductive layer 336 may be formed by a sputtering process, a CVD process, an ALD process, an electron beam evaporation process, a pulse laser deposition (PLD) process, and/or another suitable process. The first conductive layer 336 may be formed using, for example, tungsten, titanium, titanium nitride, tantalum, tantalum nitride, aluminum, aluminum nitride, titanium aluminum nitride, tungsten nitride, and/or another suitable material. These materials may be used alone or in any combination.

Figure 13:
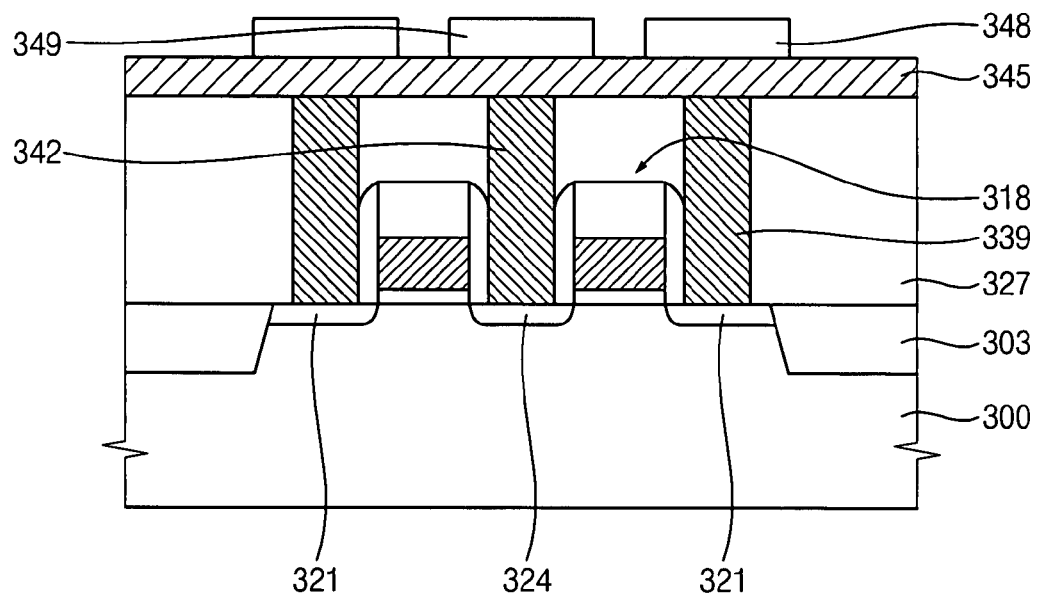

As shown in FIG. 13, the first conductive layer 336 may be partially removed by a chemical mechanical polishing (CMP) process and/or an etch-back process until the first insulating interlayer 327 is uniformly exposed. Thus, a first lower contact 339 and a second lower contact 342 may be formed in the first and the second lower contact holes 330, respectively. The first lower contact 339 may be on the first contact region 321, and/or the second lower contact 342 may be formed on the second contact region 324.

A second conductive layer 345 may be formed on the first insulating interlayer 327 and the first and/or the second lower contacts 339 and 342. The second conductive layer 345 may be formed using doped polysilicon, a metal, and/or a conductive metal nitride by a sputtering process, a CVD process, an ALD process, an electron beam evaporation process, a PLD process, and/or another suitable process.

After a second insulation layer (not illustrated) is formed on the second conductive layer 345, the second insulation layer may be partially etched by a photolithography process or the like. Thus, a first insulation layer pattern 348 and a second insulation layer pattern 349 may be formed on the second conductive layer 345. The second insulation layer may be formed using a nitride and/or an oxynitride by a CVD process, a PECVD process, an ALD process, an HDP-CVD process, and/or another suitable process. The first insulation layer pattern 348 may be formed on a portion of the second conductive layer 345 under which the first lower contact 339 may be located. The second insulation layer pattern 349 may be formed on a portion of the second conductive layer 345 where the second lower contact 342 may be located.

Figure 14:
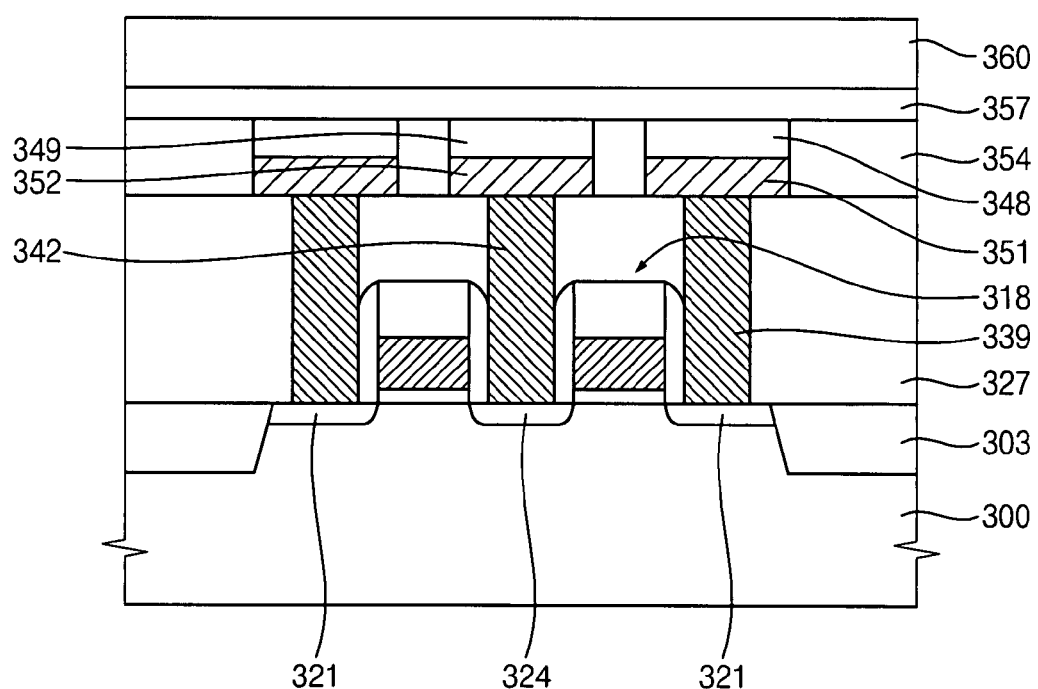

As illustrated in FIG. 14, the second conductive layer 345 may be partially etched using the first and the second insulation layer patterns 348 and 349 as etching masks, to thereby form combined pads and lower wirings 351 and 352. The pad and lower wiring 351 may be located on the first lower contact 339 and/or the first insulating interlayer 327. The pad and lower wiring 352 may be on the second lower contact 342 and/or the first insulating interlayer 327. The pad and lower wiring 351 may be electrically connected to the first contact region 321 through the first lower contact 339, and/or the pad and lower wiring 352 may be electrically connected to the second contact region 352 through the second lower contact 342.

A second insulating interlayer 354 may be formed on the first insulating interlayer 327 and may cover the first and/or the second insulation layer patterns 348 and 349. The second insulating interlayer 354 may be formed using, for example, an oxide by a CVD process, a PECVD process, an ALD process, an HDP-CVD process, and/or another suitable process. For example, the second insulating interlayer 354 may be formed using PSG, BPSG, USG, SOG, TEOS, PE-TEOS, FOX, HDP-CVD oxide, and/or another suitable process.

The second insulating interlayer 354 may be partially removed by an etch-back process and/or a CMP process until the first and the second insulation layer patterns 348 and 349 are exposed. For example, the second insulating interlayer 354 may be etched using a slurry that includes an abrasive such as ceria having a higher etching selectivity between an oxide and a nitride. The first and/or the second insulation layer patterns 348 and/or 349 may serve as polishing stop layers. If the second insulating interlayer 354 is partially removed, the first insulation layer pattern 348, and/or the pad 351 may be buried in the second insulating interlayer 354. The second insulation layer pattern 349 and the lower wiring 352 may be simultaneously buried in the second insulating interlayer 354.

A third insulation layer 357 may be formed on the second insulating interlayer 354, the first insulation layer pattern 348, and/or the second insulation layer pattern 349. The third insulation layer 357 may be formed using a nitride and/or an oxynitride by a CVD process, a PECVD process, an ALD process, an HDP-CVD process, and/or another suitable process.

A sacrificial layer 360 including an oxide may be formed on the third insulation layer 357. The sacrificial layer 360 may be formed using oxide by a CVD process, a PECVD process, an ALD process, an HDP-CVD process, and/or another suitable process.

Figure 15:
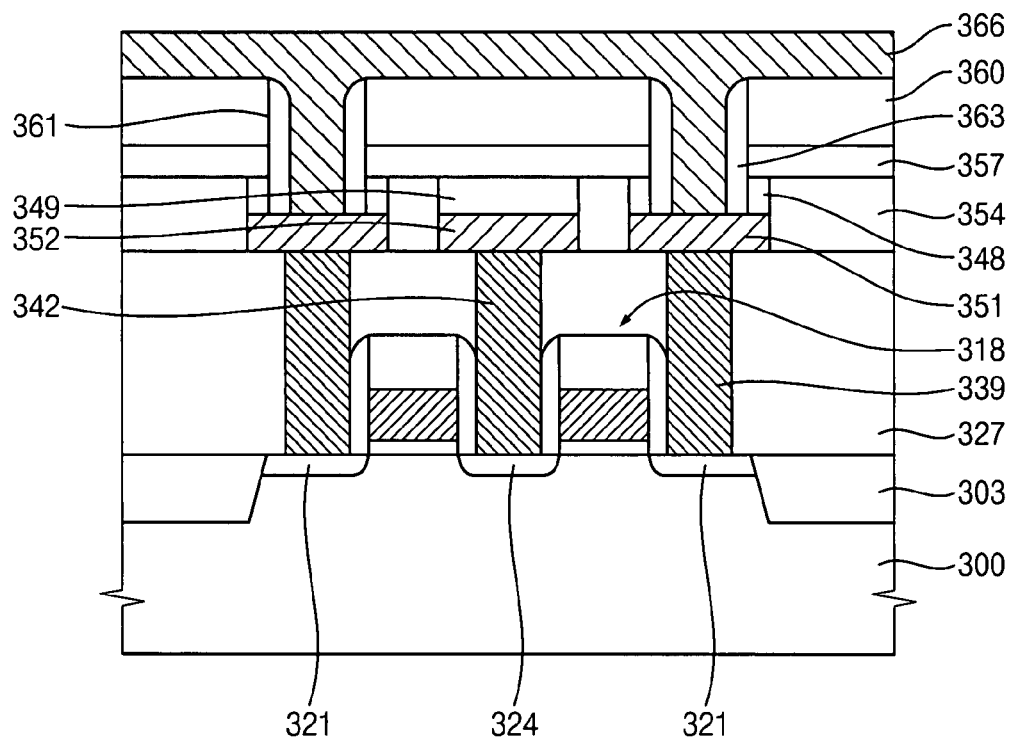

As shown in FIG. 15, the sacrificial layer 360, the third insulation layer 357, and/or the first insulation layer pattern 348 may be partially etched by a photolithography process or the like so that an opening 361 exposing the pad 351 may be formed.

A fourth insulation layer (not illustrated) may be formed on a sidewall of the opening 361, the pad 351, and/or the sacrificial layer 360 to fill up the opening 361. The fourth insulation layer may be anisotropically etched to form a preliminary spacer 363 on the sidewall of the opening 361. For example, the fourth insulation layer may be formed using silicon nitride and/or another suitable material.

A third conductive layer 366 may be formed on the pad 351 and the sacrificial layer 360 to fill up the opening 361. The third conductive layer 366 may be formed using doped polysilicon, a metal, and/or a conductive metal nitride. For example, the third conductive layer 366 may be formed using tungsten, tungsten nitride, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, and/or any other suitable material. The third conductive layer 366 may be formed by a sputtering process, a CVD process, an ALD process, an electron beam evaporation process, a PLD process, and/or another suitable process.

Figure 16:
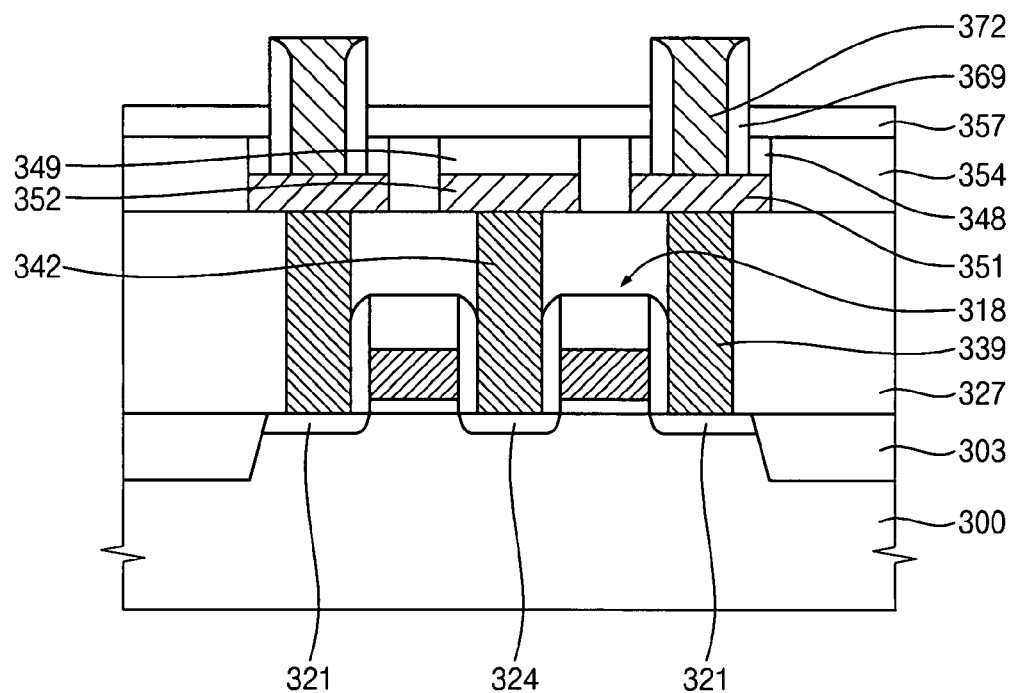

As illustrated in FIG. 16, the third conductive layer 366 may be partially removed by a CMP process or the like until the sacrificial layer 360 is exposed, thereby forming a preliminary lower electrode 372 that fills up the opening 361. The preliminary spacer 369 may be between the sidewall of the opening 361 and a sidewall of the preliminary lower electrode 372.

The sacrificial layer 360 may be removed by an etch-back process and/or a CMP process to expose the second insulation layer 357. If the sacrificial layer 360 is removed, the preliminary spacer 369 and/or the preliminary lower electrode 372 may each protrude from the second insulation layer 357 as pillar-like shapes.

Figure 17:
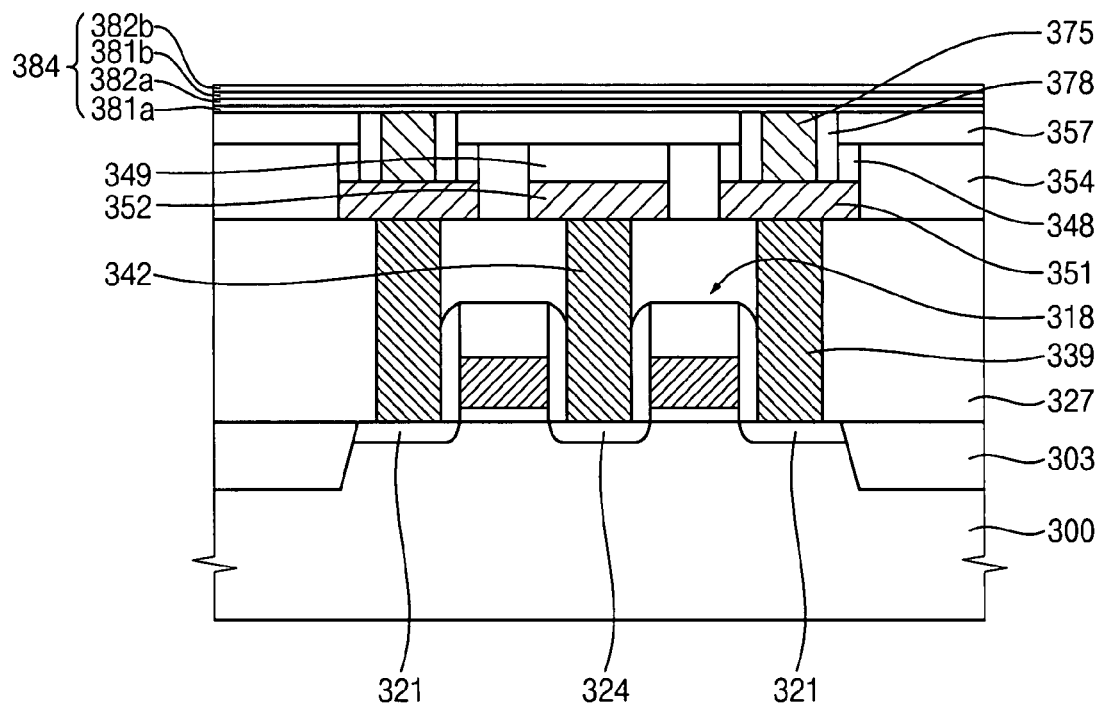

As illustrated in FIG. 17, upper portions of the preliminary spacer 369 and the preliminary lower electrode 372 may be removed by a CMP process to form a lower electrode 375 and/or a spacer 378 on the pad 351. For example, the lower electrode 375 and the spacer 378 may be formed using a slurry that includes an abrasive containing ceria. The CMP process may remove the second insulation layer 357 and form the lower electrode 375 and the spacer 378.

A phase-change material layer 384 containing carbon may be formed on the second insulation layer 357, the lower electrode 375, and/or the spacer 378. The carbon-containing phase-change material layer 384 may include a plurality of first composite material layers 381a and 381b and a plurality of second composite material layers 382a and 382b. Each of the first composite material layers 381a and 381b may include germanium, tellurium, and/or carbon, and each of the second composite material layers 382a and 382b may include antimony, tellurium, and/or carbon, or vice versa. The carbon-containing phase-change material layer 384 may thus include germanium-antimony-tellurium. The phase-change material layer 384 may include about 1 to about 6 percent by weight of carbon, about 15 to about 30 percent by weight of germanium, about 15 to about 25 percent by weight of antimony, and/or about 39 to about 69 percent by weight of tellurium. The phase-change material layer 384 may be formed by processes substantially similar to the processes described with reference to FIGS. 1 and 2. Although FIGS. 17 and 18 may show the first and the second composite layers as physically identifiable, the first and the second composite layers may not be physically identifiable. In other words, the phase-change material layer 384 may appear as a substantially homogenous layer having a substantially uniform GST concentration.

Figure 18:
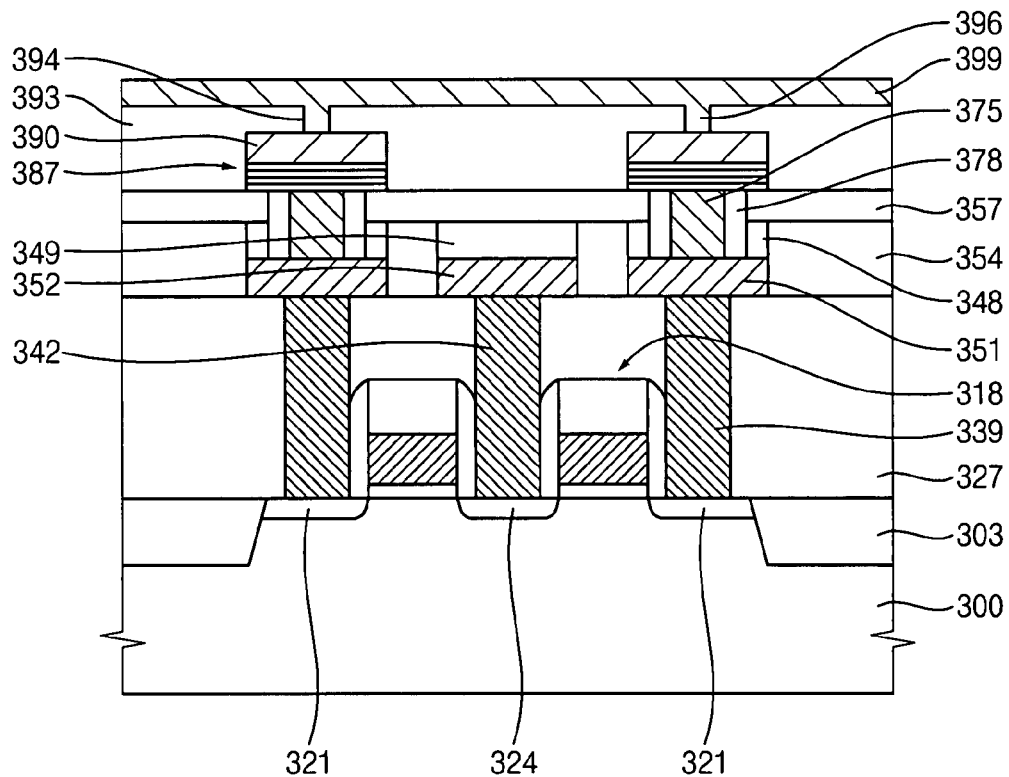

As illustrated in FIG. 18, a fourth conductive layer (not illustrated) may be formed on the phase-change material layer 384. The fourth conductive layer may be formed of doped polysilicon, a metal, and/or a conductive metal nitride by a sputtering process, a CVD process, an ALD process, an electron beam evaporation process, a PLD process, and/or another suitable process. The fourth conductive layer and/or the phase-change material layer 384 may be partially etched by a photolithography process or the like so that a phase-change material layer pattern 387 and/or an upper electrode 390 may be stacked on the lower electrode 378 and the second insulation layer 357. The phase-change material layer pattern 387 may be on the lower electrode 378, the spacer 375, and/or the second insulation layer 357. The upper electrode 390 may be on the phase-change material layer pattern 387.

A third insulating interlayer 393 may be formed on the second insulation layer 357 to cover the upper electrode 390. The third insulating interlayer 393 may be formed using an oxide by a CVD process, a PECVD process, an ALD process, an HDP-CVD process, and/or another suitable process.

An upper contact hole 394 that may expose the upper electrode 390 may be formed through the third insulating interlayer 393 by partially etching the third insulating interlayer 393 through a photolithography process or the like.

An upper contact 396 may be formed on the upper electrode 390 in the upper contact hole 394, and an upper wiring 399 may be formed on the upper contact 396 and/or the third insulating interlayer 393. The upper contact 396 and the upper wiring 399 may be integrally formed. The upper contact 396 and the upper wiring 399 may be formed using a metal and/or a conductive metal nitride by a sputtering process, a CVD process, an ALD process, an electron beam evaporation process, a PLD process, and/or any other suitable process.

FIGS. 19 to 23 are cross-sectional views illustrating an example method of manufacturing a phase-change memory device having an example embodiment phase-change layer as described above.

Figure 19:
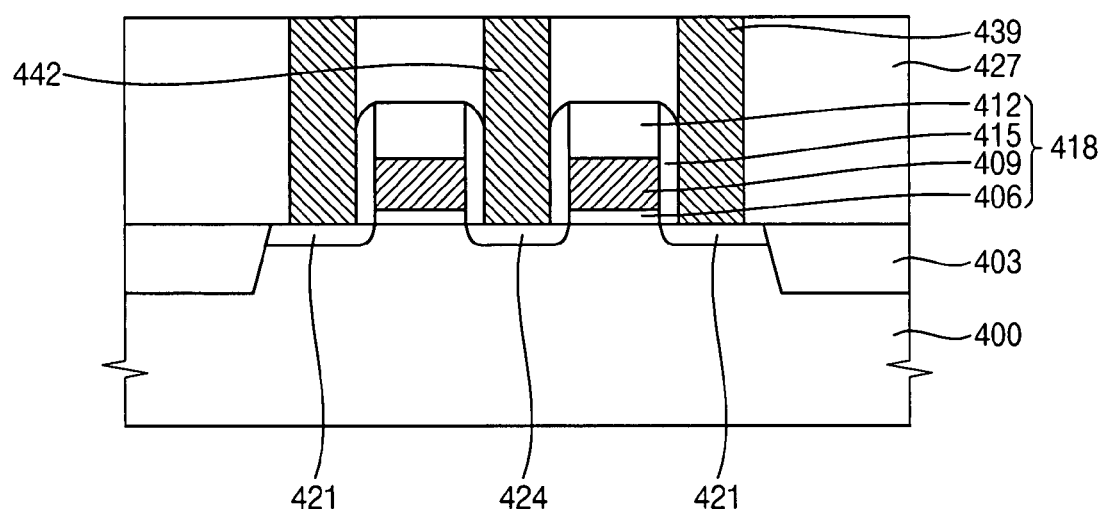
FIGS. 19 to 23 are cross-sectional views illustrating a further example methods of manufacturing a phase-change memory device.

As illustrated in FIG. 19, an isolation layer 403 may be formed on a semiconductor substrate 400 to define an active region of the semiconductor substrate 400.

A gate insulation layer (not illustrated), a gate conductive layer (not illustrated), and a gate mask layer (not illustrated) may be sequentially formed on the active region of the semiconductor substrate 400. The gate insulation layer, the gate conductive layer, and/or the gate mask layer may be partially etched to form a gate insulation layer pattern 406, a gate electrode 409, and a gate mask 412 on the semiconductor substrate 400. The gate electrode 409 may include a single layer structure that has a doped polysilicon layer, a metal layer, and/or a conductive metal nitride layer. Alternatively, the gate electrode 409 may have a multi-layered structure that includes doped polysilicon layer, a metal layer, a conductive metal nitride layer, and/or a metal silicide layer. The gate mask 412 may be formed using a material that may have an etching selectivity relative to the gate electrode 409 and/or the gate insulation layer pattern 406.

After a first insulation layer (not illustrated) is formed on the semiconductor substrate 400 to cover the gate mask 412, the first insulation layer may be anisotropically etched to form a gate spacer 415 on sidewalls of the gate insulation layer pattern 406, the gate electrode 409, and/or the gate mask 412. Thus, gate structure 418 may be formed on the semiconductor substrate 400. The gate structure 418 may include the gate insulation layer pattern 406, the gate electrode 409, and/or the gate mask 412.

A first contact region 421 and/or a second contact region 424 may be formed at portions of the semiconductor substrate 400 adjacent to the gate structure 418. The first contact region 421 and the second contact region 424 may be formed by an ion implantation process using the gate structures 418 as implantation masks. A transistor including the first contact region 421, the second contact region 424, and the gate structures 418 may be thus formed on the semiconductor substrate 400.

A first insulating interlayer 427 may be formed on the semiconductor substrate 400 and may cover the gate structures 418. The first insulating interlayer 427 may be formed using an oxide by a CVD process, a PECVD process, an ALD process, an HDP-CVD process, and/or another suitable process.

The first insulating interlayer 427 may be partially etched by a photolithography process to form a first lower contact hole (not illustrated) and/or a second lower contact hole (not illustrated) that may partially expose the first contact region 421 and/or the second contact region 424, respectively.

A first conductive layer (not illustrated) may be formed on the first insulating interlayer 427 to fill up the first and/or the second lower contact holes. The first conductive layer may be formed using doped polysilicon, a metal, and/or a conductive metal nitride by a sputtering process, a CVD process, an ALD process, an electron beam evaporation process, a PLD process, and/or another suitable process.

The first conductive layer may be partially removed by a CMP process and/or an etch-back process until the first insulating interlayer 427 may be exposed such that a first lower contact 439 and a second lower contact 442 may be formed in the first lower contact hole and the second lower contact hole. The first lower contact 439 may be on the first contact region 421, and the second lower contact 442 may be on the second contact region 424.

Figure 20:
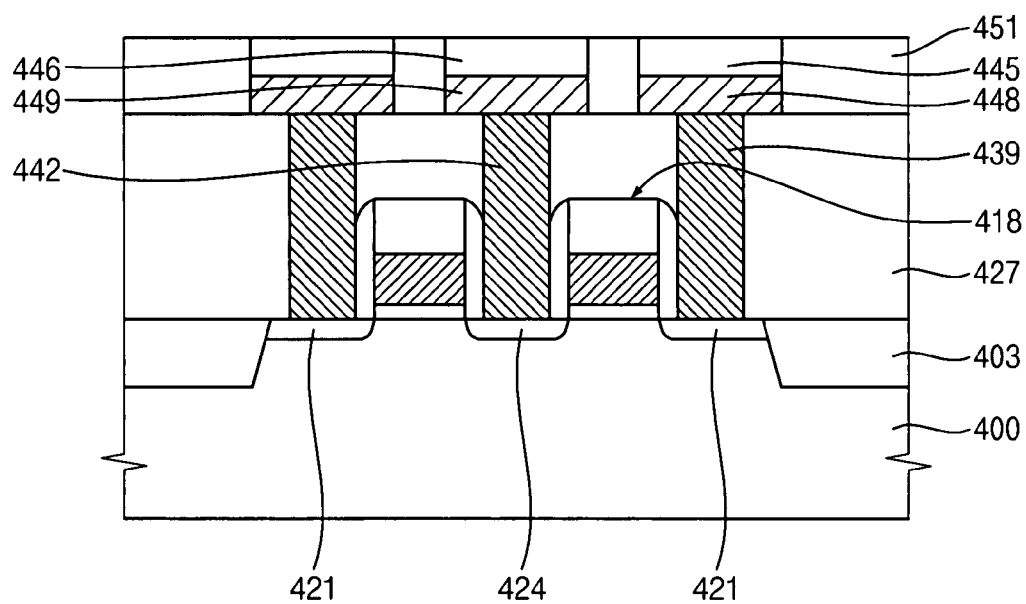

As illustrated in FIG. 20, a second conductive layer (not illustrated) and a second insulation layer (not illustrated) may be stacked on the first lower contact 439, the second lower contact 442, and the first insulating interlayer 427. The second insulation layer may be formed using a nitride and/or an oxynitride by a CVD process, a PECVD process, an ALD process, an HDP-CVD process, and/or another suitable process. The second conductive layer may be formed using doped polysilicon, a metal, and/or a conductive metal nitride by a sputtering process, a CVD process, an ALD process, an electron beam evaporation process, a PLD process, and/or another suitable process.

The second insulation layer may be partially etched by a photolithography process or the like to simultaneously form a first insulation layer pattern 445 and/or a second insulation layer pattern 446. The first insulation layer pattern 445 may be formed on a portion of the second conductive layer under which the first lower contact 439 may be located. The second insulation layer pattern 446 may be formed on a portion of the second conductive layer under which the second lower contact 442 may be located.

The second conductive layer may be etched using the first and/or the second insulation layer patterns 445 and/or 446 as etching masks, thereby forming a lower electrode 448 and/or a lower wiring 449. The lower electrode 448 may be on the first lower contact 439 and may be electrically connected to the first contact region 421 through the first lower contact 439. The lower wiring 449 may be formed on the second lower contact 442 and/or may be electrically connected to the second contact region 424 through the second lower contact 442.

A second insulating interlayer 451 may be formed on the first insulating interlayer 427 and may cover the first and/or the second insulation layer patterns 445 and/or 446. The second insulating interlayer 451 may be formed using an oxide by a CVD process, a PECVD process, an ALD process, an HDP-CVD process, and/or another suitable process.

The second insulating interlayer 451 may be partially removed by an etch-back process and/or a CMP process until the first and the second insulation layer patterns 445 and 446 may be exposed. For example, the second insulating interlayer 451 may be partially removed using a slurry that includes an abrasive containing ceria. The first and/or the second insulation layer patterns 445 and/or 446 may serve as polishing stop layers.

Figure 21:
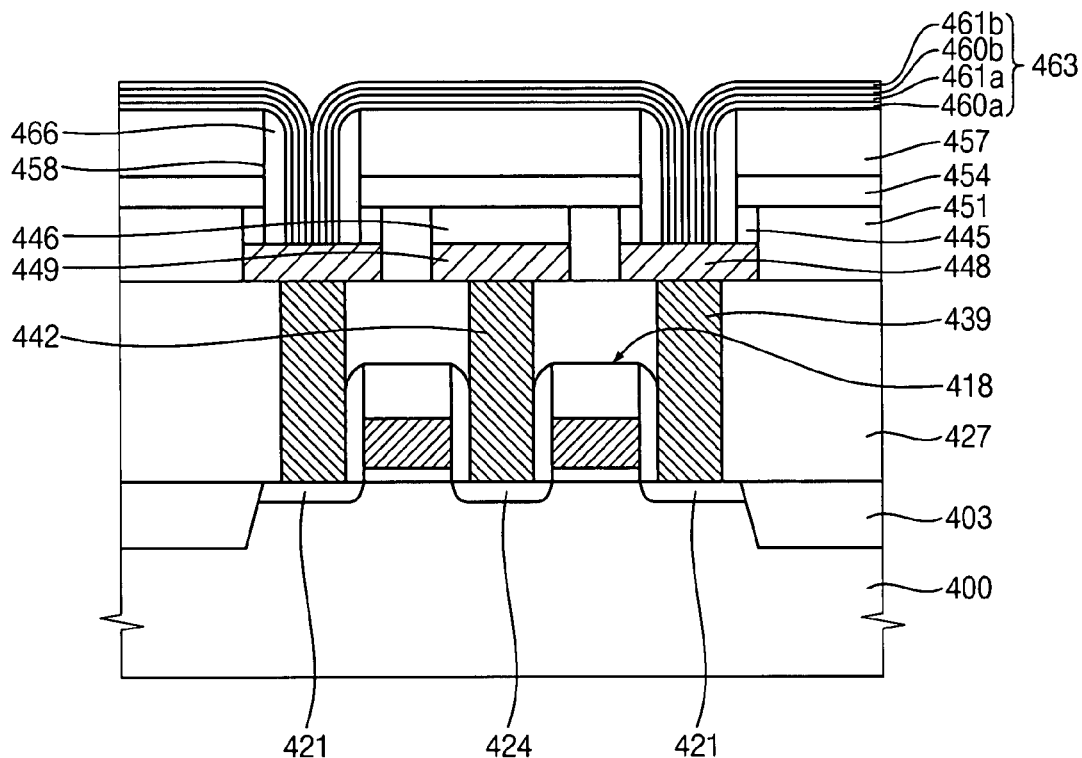

As illustrated in FIG. 21, a third insulation layer 454 may be formed on the second insulating interlayer 451, the first insulation layer pattern 445, and/or the second insulation layer pattern 446. The third insulation layer 454 may be formed using a nitride and/or an oxynitride by a CVD process, a PECVD process, an ALD process, an HDP-CVD process, and/or a similar process.

A sacrificial layer 457 may be formed on the third insulation layer 227. The sacrificial layer 457 may be formed using oxide by a CVD process, a PECVD process, an ALD process, an HDP-CVD process, and/or another suitable process.

The sacrificial layer 457, the third insulation layer 451, and/or the first insulation layer pattern 445 may be partially etched by a photolithography process or the like, thereby forming an opening 458 that may expose the lower electrode 448.

After a fourth insulation layer (not illustrated) may be formed on the lower electrode 448, a sidewall of the opening 458, and/or the sacrificial layer 457 fill up the opening 458. The fourth insulation layer may be anisotropically etched to form a preliminary spacer 466 on the sidewall of the opening 458.

Figure 22:
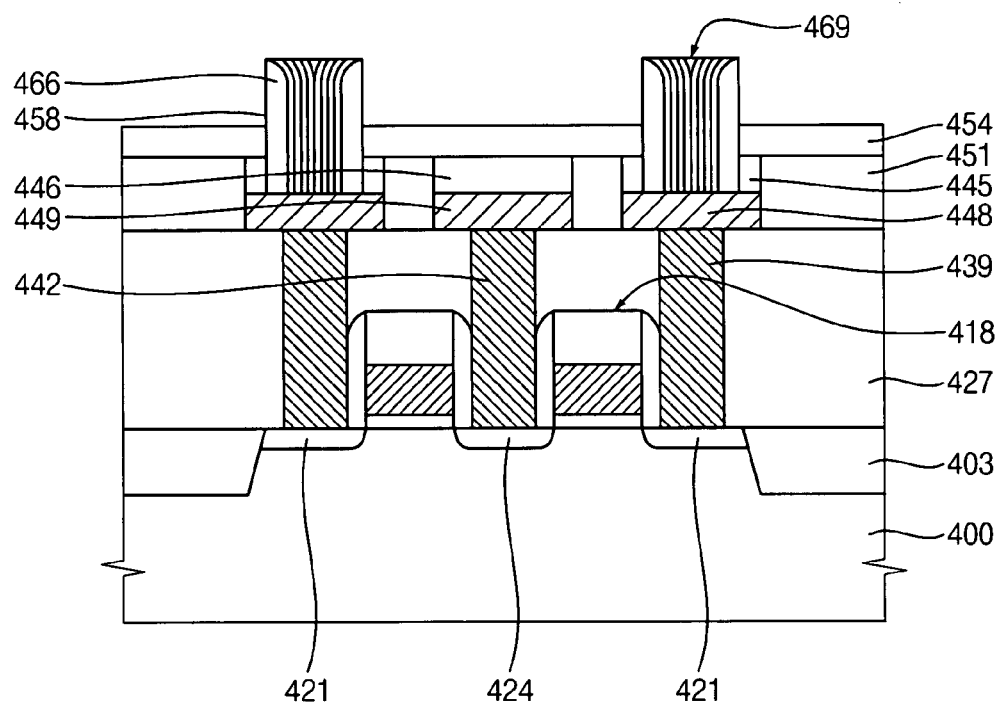
Figure 23:
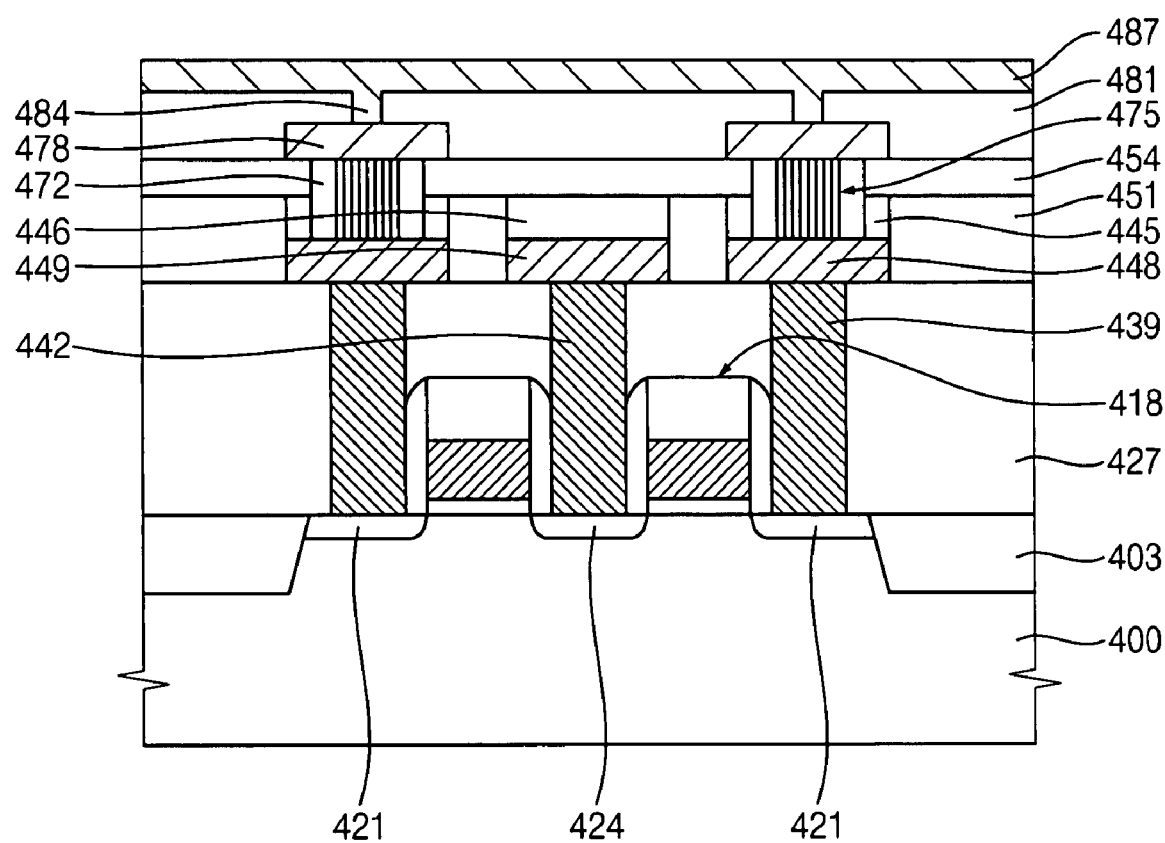

A carbon-containing phase-change material layer 463 may be formed on the lower electrode 448 and/or the sacrificial layer 457 to fill up the opening 458. The carbon-containing phase-change material layer 463 may be formed by processes substantially the same as those described with reference to FIGS. 1 and 2. The carbon-containing phase-change material layer 463 may include a plurality of first composite material layers 460a and 460b, and/or a plurality of second composite material layers 461a and 461b. Each of the first composite material layers 460a and 460b may include germanium, tellurium, and/or carbon, and each of the second composite material layers 461a and 461b may include antimony, tellurium and/or carbon, or vice versa. The carbon-containing phase-change material layer 463 may thus include germanium-antimony-tellurium. FIGS. 21 to 23 may show the first and the second composite layers as distinctly identifiable, but the first and second composite layers may not be distinctly identifiable. In other words, the carbon-containing phase-change material layer 463 may be a substantially homogenous layer having a substantially uniform GST concentration.

As illustrated in FIG. 22, the carbon-containing phase-change material layer 463 may be partially removed by a CMP process until the sacrificial layer 457 may be exposed so that a preliminary phase-change material layer pattern 469 may be formed on the lower electrode 448 in the opening 458. The preliminary spacer 466 may be between the sidewall of the opening 458 and a sidewall of the preliminary phase-change material layer pattern 469.

The sacrificial layer 457 may be removed by an etch-back process and/or a CMP process to expose the third insulation layer 454. When the sacrificial layer 457 is removed, the preliminary spacer 466 and the preliminary phase-change material layer pattern 469 may protrude from the third insulation layer 454 as pillar-like shapes.

As illustrated in FIG. 23, upper portions of the preliminary spacer 466 and/or the preliminary phase-change material layer pattern 469 may be removed by a CMP process and/or an etch-back process, thereby forming a spacer 472 and a carbon-containing phase-change material layer pattern 475 on the lower electrode 448. For example, the spacer 472 and/or the carbon-containing phase-change material layer pattern 475 may be formed using a slurry that includes an abrasive containing as ceria. When forming the spacer 472 and the carbon-containing phase-change material layer pattern 475, the third insulation layer 454 may serve as a polishing stop layer and/or an etch stop layer. The CMP process may remove the third insulation layer 454 while forming the spacer 472 and the carbon-containing phase-change material layer pattern 475.

An upper electrode 478 may be on the third insulation layer 454, the spacer 472, and/or the carbon-containing phase-change material layer pattern 475. The upper electrode 478 may be formed of doped polysilicon, a metal, and/or a conductive metal nitride by a sputtering process, a CVD process, an ALD process, an electron beam evaporation process, a PLD process, and/or another suitable method.

A third insulating interlayer 481 may be formed on the third insulation layer 454 and may cover the upper electrode 478. The third insulating interlayer 481 may be formed using oxide by a CVD process, a PECVD process, an ALD process, an HDP-CVD process, and/or another suitable method.

After an upper contact hole may expose the upper electrode 478 through the third insulating interlayer 481 by partially etching the third insulating interlayer 481, an upper contact 484 may be formed on the upper electrode 478 in the upper contact hole. An upper wiring 487 may be formed on the upper contact 484 and/or the third insulating interlayer 481. The upper contact 484 and the upper wiring 487 may be integrally and simultaneously formed using doped polysilicon, a metal, and/or a conductive metal nitride.

Example embodiments may provide a phase-change material layers including carbon that may be more easily and/or more quickly formed at a lower temperature under a helium/argon plasma environment by providing source gases for various feeding times. Additionally, example embodiment phase-change material layers including carbon may have a desired crystalline structure such as an FCC crystalline structure. Example embodiment phase-change material layers including carbon may have improved electrical characteristics such as a lower reset current and/or an improved set resistance. Further, manufacturing cost and time may be reduced because the phase-change material layer including carbon may be fabricated by a simplified series of processes.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of forming a phase-change material layer comprising:
   generating a plasma including an inert gas in a reaction chamber;
   introducing a first source gas including a first material into the reaction chamber to form a layer of the first material on an object;
   introducing a second source gas including a second material into the reaction chamber to form a first composite material layer on the object, the first composite layer including the first material and the second material;
   introducing a third source gas including a third material into the reaction chamber to form a layer of the third material on the first composite material layer; and
   introducing a fourth source gas including a fourth material into the reaction chamber to form a second composite material layer on the first composite material layer, the second composite material layer including the third material and the fourth material.

2. The method of claim 1, wherein generating the plasma includes
   introducing the inert gas into the reaction chamber,
   pre-heating the inert gas,
   stabilizing the inert gas, and
   heating the inert gas to a plasma state.

3. The method of claim 1, wherein the inert gas includes argon and helium.

4. The method of claim 3, wherein
   pre-heating includes heating the argon and helium for about 30 seconds to about 90 seconds,
   stabilizing includes maintaining a constant temperature of the argon and helium gas for about 1 second to about 4 seconds, and
   heating includes applying a power of about 20 Watts to about 200 Watts to the argon and helium gas for about 5 seconds to about 15 seconds.

5. The method of claim 3, wherein a flow rate ratio between the helium gas and the argon gas is in a range of about 1:0.06 to about 1:1.5.

6. The method of claim 1, wherein the first material includes germanium (Ge) and wherein the third material includes antimony (Sb).

7. The method of claim 6, wherein the first material includes at least one of Ge(iso-Propane)3H, GeCl4, Ge(Methane)4, Ge(Methane)4N3, Ge(Ethane)4, Ge(Methane)3NEthane2, Ge(iso-Butane)3H, Ge(n-Butane)4, Sb(GeEthane3)3 and Ge(Cyclopropane)2.

8. The method of claim 6, wherein the third material includes at least one of Sb(iso-Butane)3, SbCl3, SbCl5, Sb(Methane3), Sb(Ethane)3, Sb(iso-Propane)3, Sb(t-Butane)3, Sb[N(Methane)2]3 and Sb(Cyclopropane)3.

9. The method of claim 1, wherein the first source gas is introduced at a temperature of about 100° C. to about 300° C. for about 0.1 second to about 2 seconds, and wherein introducing the first source gas includes applying a power of about 20 Watts to about 200 Watts at a pressure of about 1 Torr to about 5 Torr to form the first material layer.

10. The method of claim 1, wherein the first, the second, the third, and the fourth source gases are introduced with a first, a second, a third, and a fourth carrier gas respectively, the first, the second, the third, and the fourth carrier gases including argon.

11. The method of claim 1, further comprising:
    introducing a first purge gas into the reaction chamber before introducing the second source gas, the first purge gas including at least one of helium and argon.

12. The method of claim 1, wherein the second material and the fourth material include tellurium (Te).

13. The method of claim 12, wherein the second and the fourth materials include at least one of Te(iso-Butane)2, TeCl4, Te(Methane)2, Te(Ethane)2, Te(n-Propane)2, Te(iso-Propane)2 and Te(t-Butane)2.

14. The method of claim 1, wherein the second and the fourth source gases are introduced at a temperature of about 100° C. to about 300° C. for about 0.1 second to about 1 second, and wherein introducing the second and the fourth source gases includes applying a power of about 20 Watts to about 200 Watts at a pressure of about 1 Torr to about 5 Torr.

15. The method of claim 1, wherein the third source gas is introduced at a temperature of about 100° C. to about 300° C. for about 0.1 second to about 1 second, and wherein introducing the third source gas includes applying a power of about 20 Watts to about 200 Watts at a pressure of about 1 Torr to about 5 Torr to form the third material layer.

16. The method of claim 1, further comprising:
    introducing a second purge gas into the reaction chamber before introducing the third source gas, the second purge gas including at least one of helium and argon.

17. The method of claim 1, further comprising:
    introducing a third purge gas into the reaction chamber before introducing the fourth source gas, the third purge gas including at least one of helium and argon.

18. The method of claim 1, wherein further comprising:
introducing a fourth purge gas into the reaction chamber after the second composite material layer is formed, the fourth purge gas including at least one of helium and argon.

19. The method of claim 1, wherein the first material includes antimony and wherein the third material includes germanium.

20. The method of claim 1, further comprising:
repeating at least once each of the introducing of the first, the second, the third, and fourth source gases so as to form a plurality of the first composite material layers and a plurality of the second composite material layers.

21. The method of claim 20, wherein the first composite layers alternate with the second composite material layers.

22. A method of forming a phase-change material layer, the method comprising:
forming a first material layer on a substrate loaded in a reaction chamber by exposing the substrate to a first source gas including the first material under an atmosphere including at least one of a helium plasma and an argon plasma;
forming a second material layer on the substrate by exposing the first material layer to a second source gas including the second material under the atmosphere;
forming a third material layer on the second material layer by exposing the second material layer to a third source gas including the third material under the atmosphere; and
forming a fourth material layer on the third material layer by exposing the third material layer to a fourth source gas including the fourth material under the atmosphere.

23. The method of claim 22, wherein the at least one of the helium plasma and the argon plasma are generated by introducing at least one of a helium gas and an argon gas into a reaction chamber, pre-heating the at least one of the helium gas and the argon gas, stabilizing the at least one of the helium gas and the argon gas, and heating the at least one of the helium gas and the argon gas into a plasma phase.

24. The method of claim 23, wherein the second source gas is substantially similar to the fourth source gas.

25. The method of claim 22, wherein the substrate is exposed to the first source gas at a temperature of about 100° C. to about 300° C. for about 0.1 second to about 2.0 seconds.

26. The method of claim 22, further comprising:
introducing a first purge gas including at least one of helium and argon into the reaction chamber for about 0.1 second to about 2 seconds before forming the germanium-tellurium layer;
introducing a second purge gas including at least one of helium and argon into the reaction chamber for about 0.1 second to about 2 seconds before forming the antimony layer;
introducing a third purge gas at least one of including helium and argon into the reaction chamber for about 0.1 second to about 2 seconds before forming antimony-tellurium layer; and
introducing a fourth purge gas including at least one of helium and argon into the reaction chamber for about 0.1 second to about 2.0 seconds after forming the antimony-tellurium layer.

27. The method of claim 22, wherein the first material is germanium, the second material is tellurium, the third material is antimony, and the fourth material is tellurium, and wherein the first and the second material layers form a germanium-tellurium layer, and wherein the third and the fourth material layers form an antimony-tellurium layer.

28. A method of forming a phase-change memory device, the method comprising:
forming a lower electrode on a substrate;
forming a phase-change material layer including germanium-antimony-tellurium and carbon on the lower electrode, the forming including
forming a first material layer on a substrate loaded in a reaction chamber by exposing the substrate to a first source gas including the first material under an atmosphere including at least one of a helium plasma and an argon plasma;
forming a second material layer on the substrate by exposing the first material layer to a second source gas including the second material under the atmosphere;
forming a third material layer on the second material layer by exposing the second material layer to a third source gas including the third material under the atmosphere; and
forming a fourth material layer on the third material layer by exposing the third material layer to a fourth source gas including the fourth material under the atmosphere; and
forming an upper electrode on the phase-change material layer.

29. The method of claim 28, wherein the first material is germanium, the second material is tellurium, the third material is antimony, and the fourth material is tellurium, and wherein the first and the second material layers form a germanium-tellurium layer, and wherein the third and the fourth material layers form an antimony-tellurium layer.

30. The method of claim 29, wherein
the lower electrode is exposed to the first source gas at a temperature of about 100° C. to about 300° C. for about 0.1 second to about 2 seconds,
the second source gas is substantially similar to the fourth source gas,
the second and the fourth source gases are provided at a temperature of about 100° C. to about 300° C. for about 0.1 second to about 1 second, and
the germanium-tellurium layer is exposed to a third source gas at a temperature of about 100° C. to about 300° C. for about 0.1 second to about 2 seconds.

31. The method of claim 29, further comprising:
introducing a first purge gas including at least one of helium and argon into the reaction chamber for about 0.1 second to about 2 seconds before forming the germanium-tellurium layer;
introducing a second purge gas including at least one of helium and argon into the reaction chamber for about 0.1 second to about 2 seconds before forming the antimony layer;
introducing a third purge gas at least one of including helium and argon into the reaction chamber for about 0.1 second to about 2 seconds before forming antimony-tellurium layer; and
introducing a fourth purge gas including at least one of helium and argon into the reaction chamber for about 0.1 second to about 2.0 seconds after forming the antimony-tellurium layer.

32. The method of claim 28, further comprising:
forming a contact region in a portion of the substrate, wherein the lower electrode is electrically connected to the contact region.

* * * * *